(12) United States Patent
Nakajima et al.

(10) Patent No.: US 6,473,336 B2
(45) Date of Patent: Oct. 29, 2002

(54) MAGNETIC MEMORY DEVICE

(75) Inventors: Kentaro Nakajima, Yokohama; Koichiro Inomata, Sendai; Yoshiaki Saito, Kawasaki; Masayuki Sagoi, Yokohama, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 54 days.

(21) Appl. No.: 09/735,629

(22) Filed: Dec. 14, 2000

(65) Prior Publication Data

US 2002/0006058 A1 Jan. 17, 2002

(30) Foreign Application Priority Data

Dec. 16, 1999 (JP) .............................. 11-357469
Mar. 17, 2000 (JP) ........................... 2000-075168
Nov. 10, 2000 (JP) ........................... 2000-344274

(51) Int. Cl.$^7$ ............................... G11C 17/14
(52) U.S. Cl. ...................... 365/171; 365/158
(58) Field of Search ................. 365/171, 158, 365/161

(56) References Cited

U.S. PATENT DOCUMENTS

| | | | |
|---|---|---|---|
| 5,304,975 A | 4/1994 | Saito et al. | 338/32 |
| 5,365,212 A | 11/1994 | Saito et al. | 338/32 |
| 5,500,633 A | 3/1996 | Saito et al. | 338/32 |
| 5,523,172 A | 6/1996 | Saito et al. | 428/611 |
| 5,534,355 A | 7/1996 | Okuno et al. | 428/611 |
| 5,578,385 A | 11/1996 | Saito et al. | 428/611 |
| 5,616,370 A | 4/1997 | Okuno et al. | 427/547 |
| 5,700,588 A | 12/1997 | Saito et al. | 428/611 |
| 5,716,719 A | 2/1998 | Saito et al. | 428/611 |
| 5,734,605 A | 3/1998 | Zhu et al. | 365/173 |
| 5,745,406 A | 4/1998 | Yamane et al. | 365/158 |
| 5,747,859 A | 5/1998 | Mizushima et al. | 257/421 |
| 5,773,156 A | 6/1998 | Inomata et al. | 428/611 |
| 5,825,685 A | 10/1998 | Yamane et al. | 365/158 |
| 5,930,164 A | 7/1999 | Zhu | 365/171 |
| 5,973,334 A | 10/1999 | Mizushima et al. | 257/25 |
| 6,021,065 A | 2/2000 | Daughton et al. | 365/158 |
| 6,069,820 A | 5/2000 | Inomata et al. | 365/171 |
| 6,111,783 A | * 8/2000 | Tran et al. | 365/171 |
| 6,114,056 A | 9/2000 | Inomata et al. | 429/231.8 |

OTHER PUBLICATIONS

R. Scheuerlein, et al., IEEE International Solid–State Circuits Conference, Paper TA 7.2, pp. 128–129, 94–95 and 409, "A 10NS Read and Write Non–Volatile Memory Array Using a Magnetic Tunnel Junction and FET Switch in Each Cell", Feb. 8, 2000.

B. A. Everitt, et al., IEEE Transactions on Magnetics, vol. 33, No. 5, pp. 3289–3291, "Single–Domain Model for Pseudo Spin Valve MRAM Cells", Sep. 1997.

J. L. Brown, et al., IEEE Transactions on Components, Packing, and Manufacturing Technology, Part A, vol. 17, No. 3, pp. 373–379, "1–MB Memory Chip Using Giant Magnetoresistive Memory Cells", Sep. 1994.

M. Sato, et al., IEEE Transactions on Magnetics, vol. 33, No. 5, pp. 3553–3555, "Spin–Valve–Like Properties and Annealing Effect in Ferromagnetic Tunnel Junctions", Sep. 1997.

J. M. Daughton, J. Appl. Phys., vol. 81, No. 8, pp. 3758–3763, "Magnetic Tunneling Applied to Memory (Invited)", Apr. 15, 1997.

* cited by examiner

*Primary Examiner*—Vu A. Le
(74) *Attorney, Agent, or Firm*—Oblon, Spivak, McClelland, Maier & Neustadt, P.C.

(57) ABSTRACT

A magnetic memory device comprises a memory cell assembled by first and second tunnel junction portions and a switch, each of the first and second tunnel junction portions being formed of a stack of a pinned layer in which a magnetization direction is fixed and a record layer in which a magnetization direction changes depending on an external magnetic field. A first data line is connected to a first end of the first tunnel junction portion. A second data line is connected to the first end of the second tunnel junction portion. A bit line is connected to the second end of the first tunnel junction portion and the second end of the second tunnel junction portion via the switch.

26 Claims, 29 Drawing Sheets

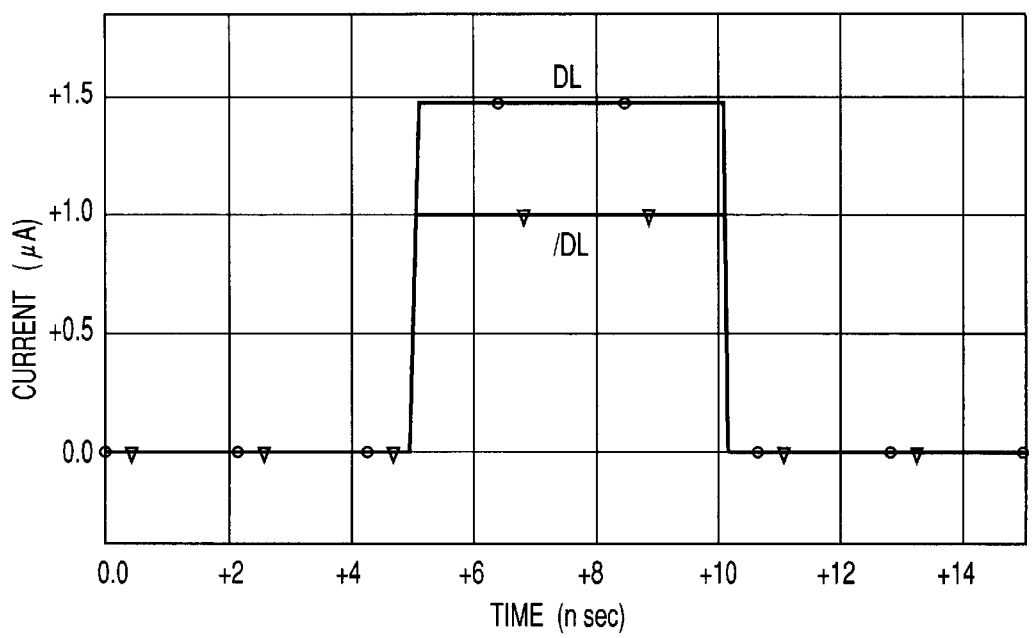
F I G. 2
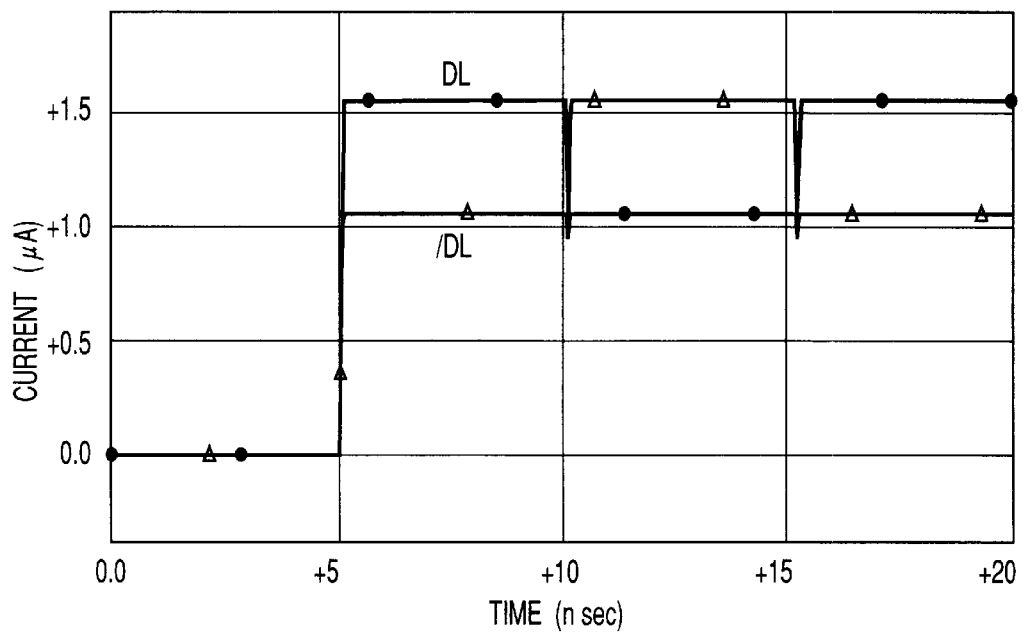
F I G. 3

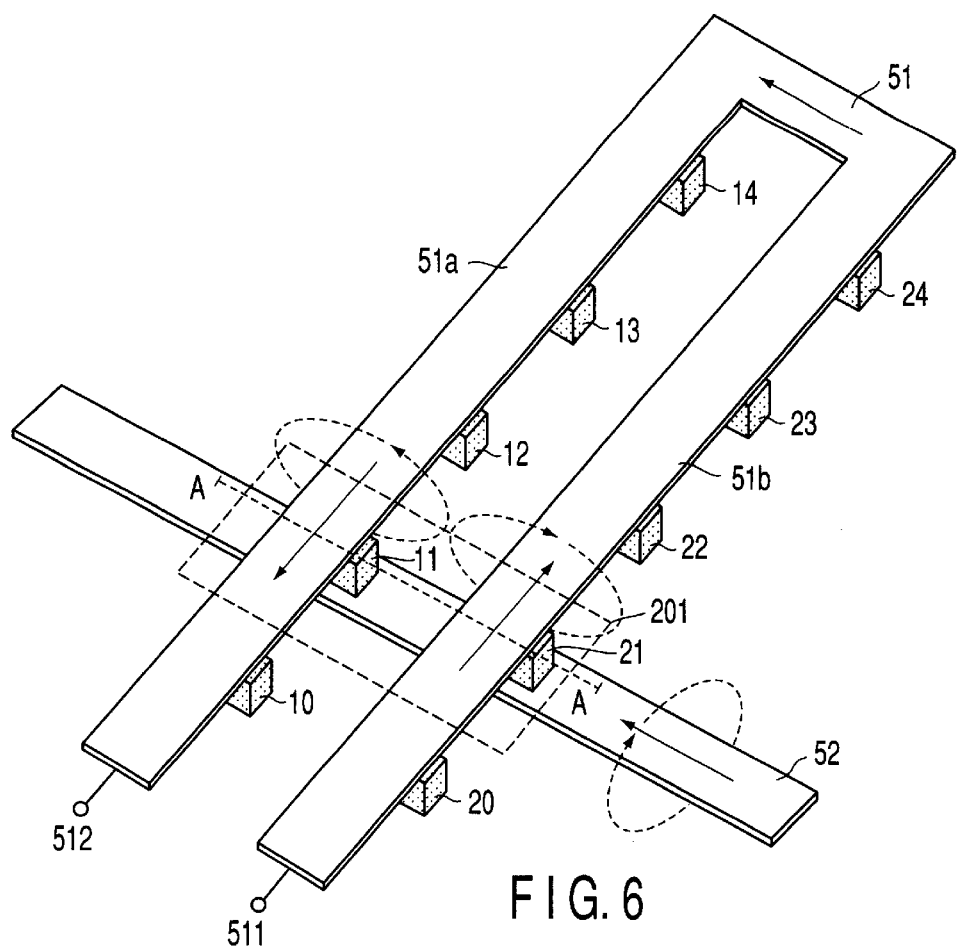
F I G. 6
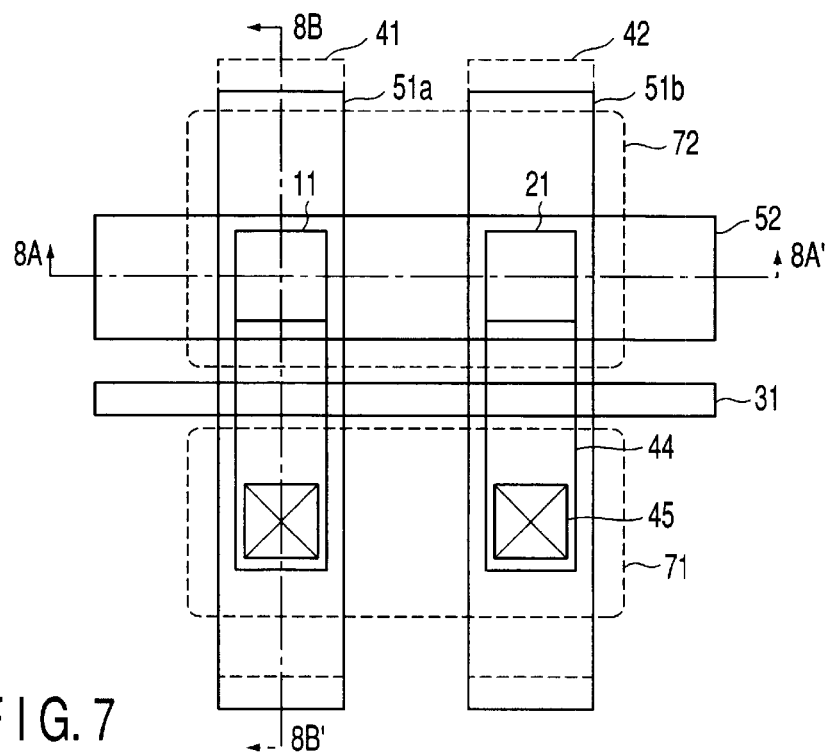
F I G. 7

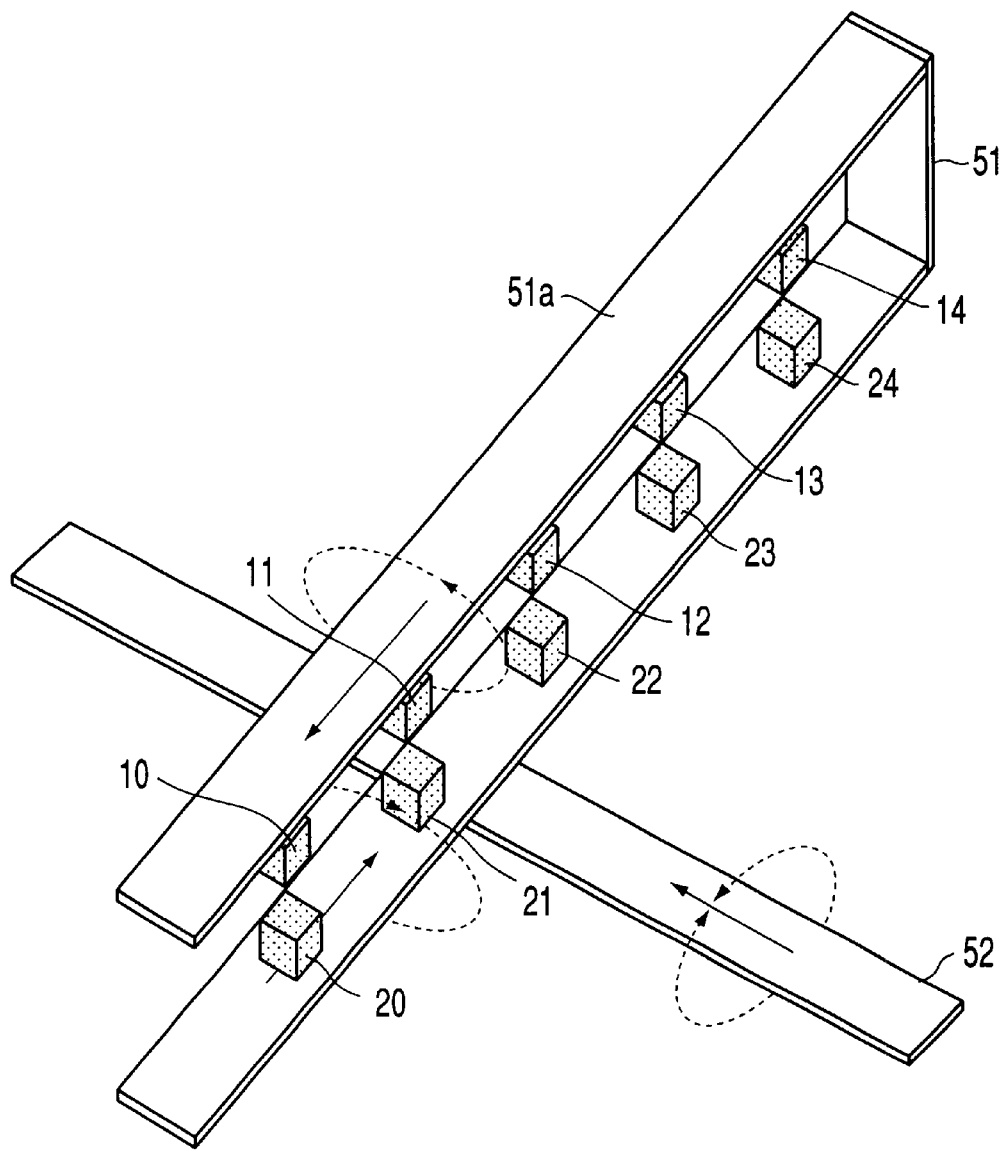
F I G. 13

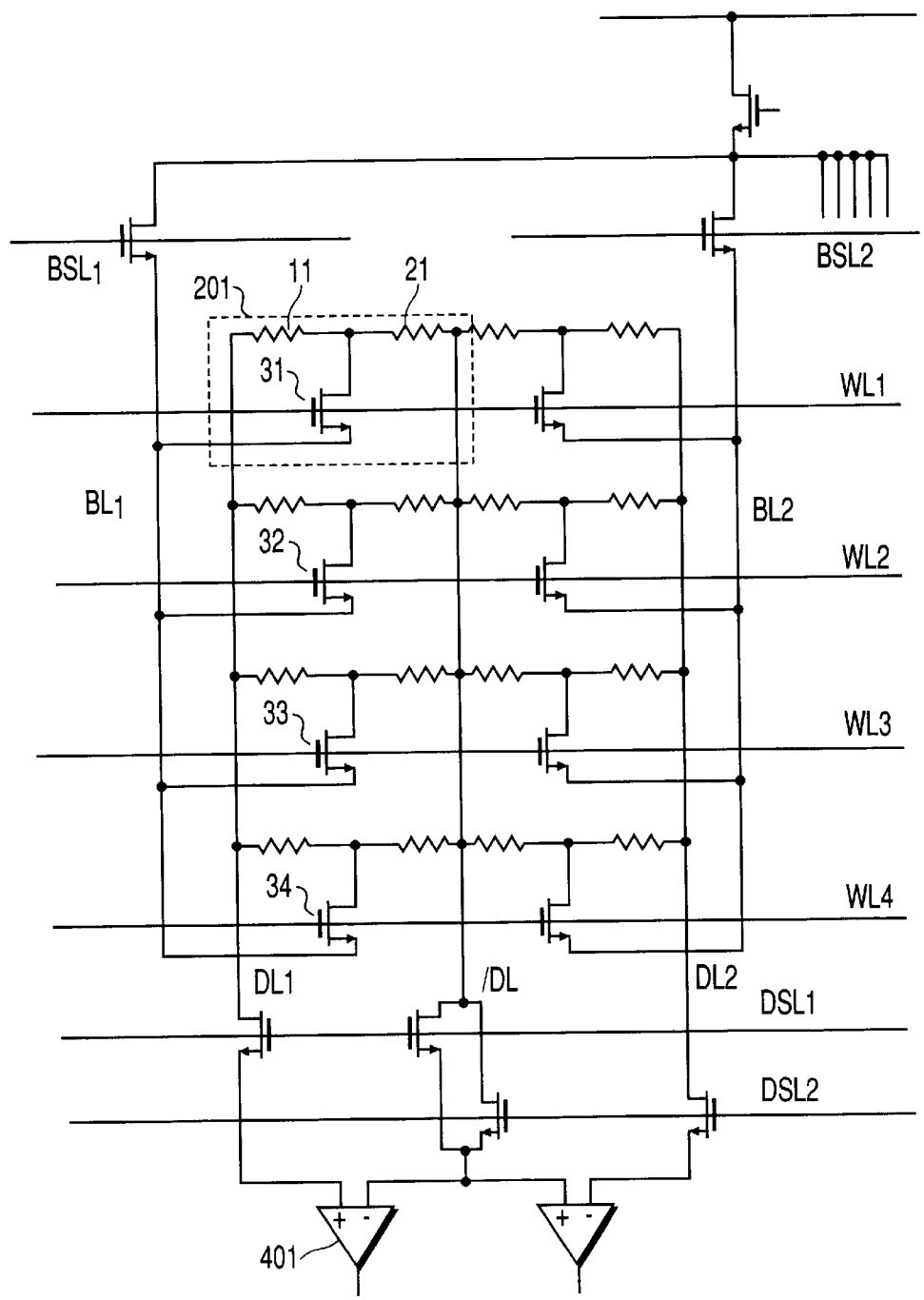
F I G. 23

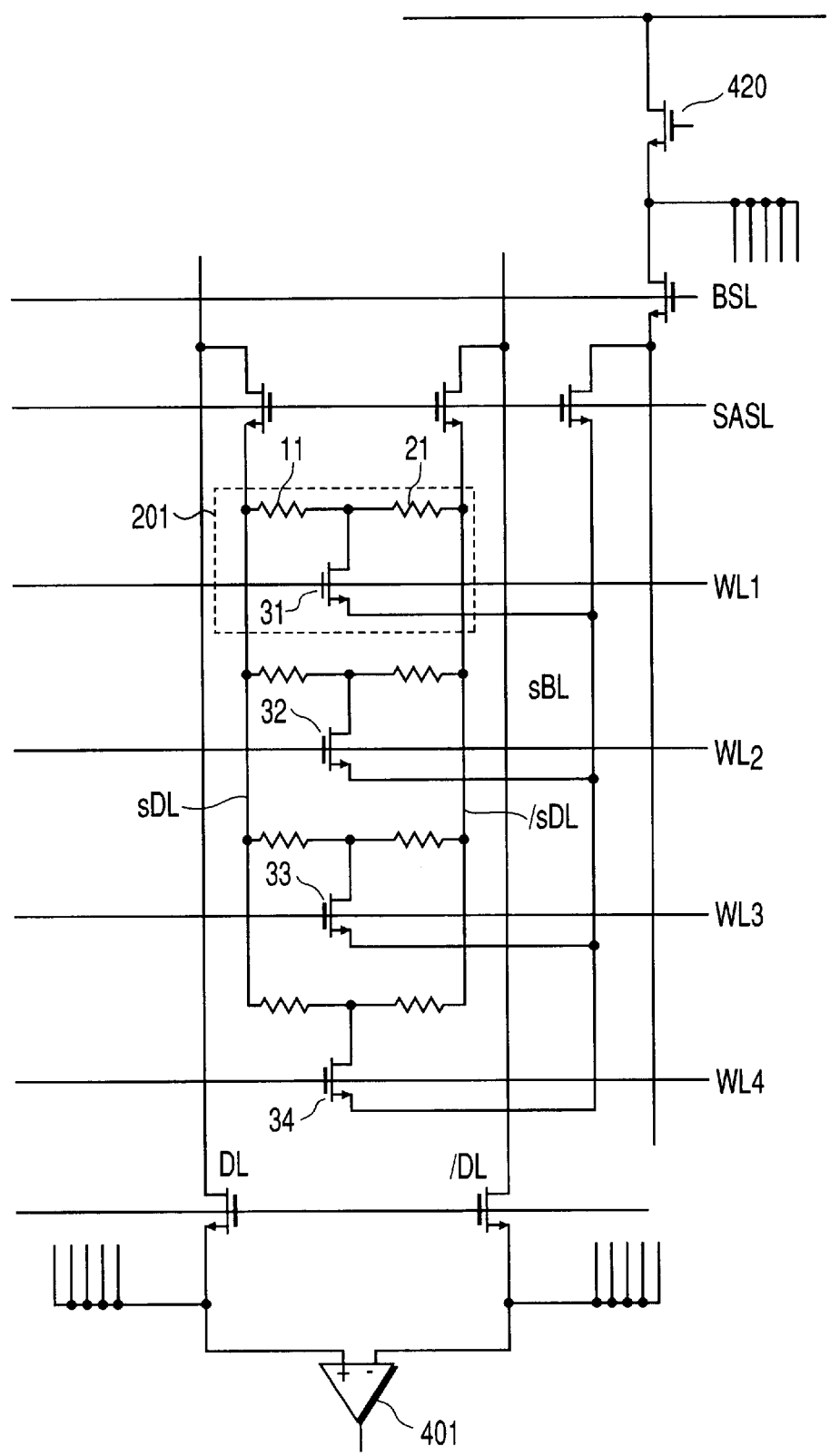
F I G. 24

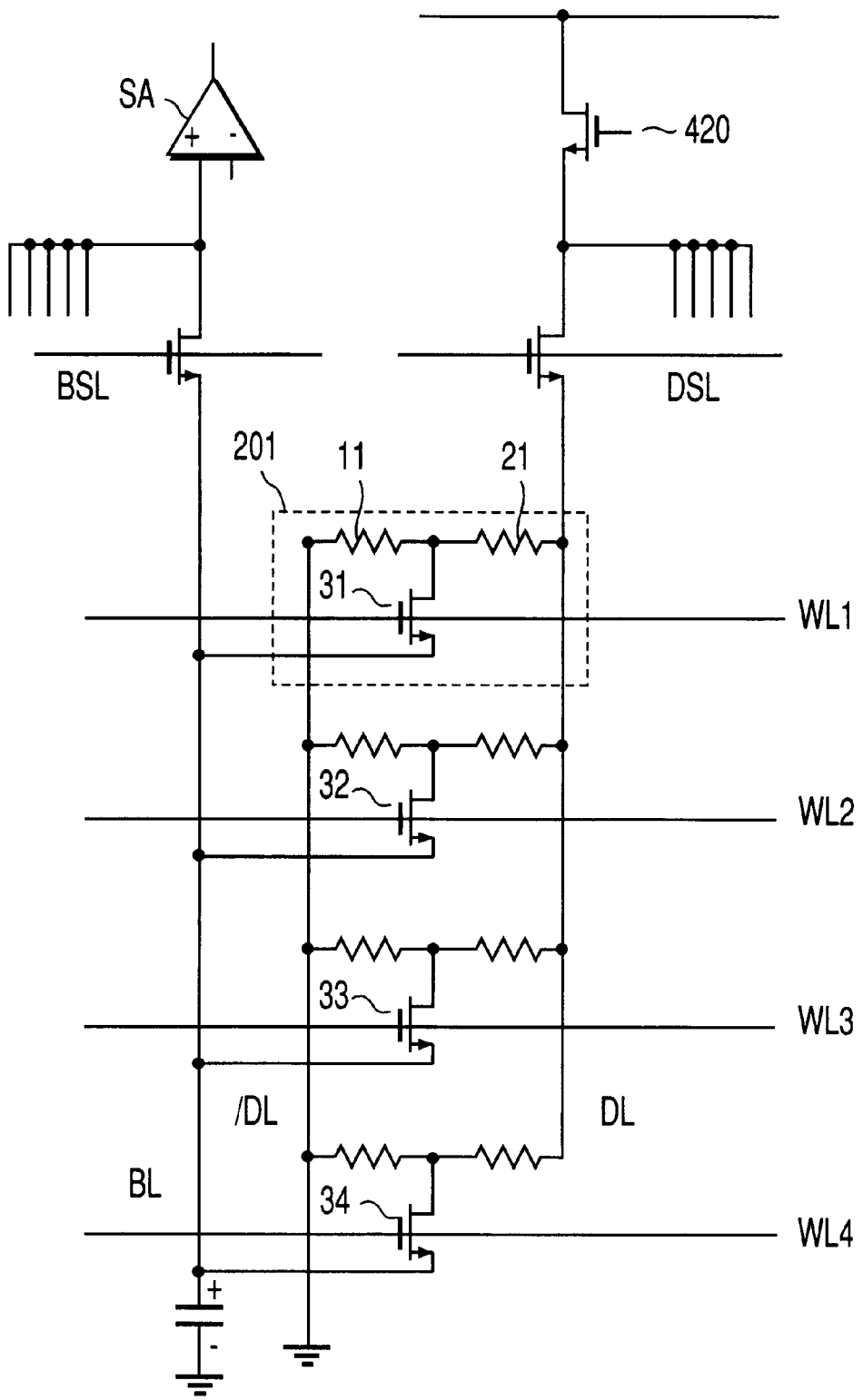
F I G. 29

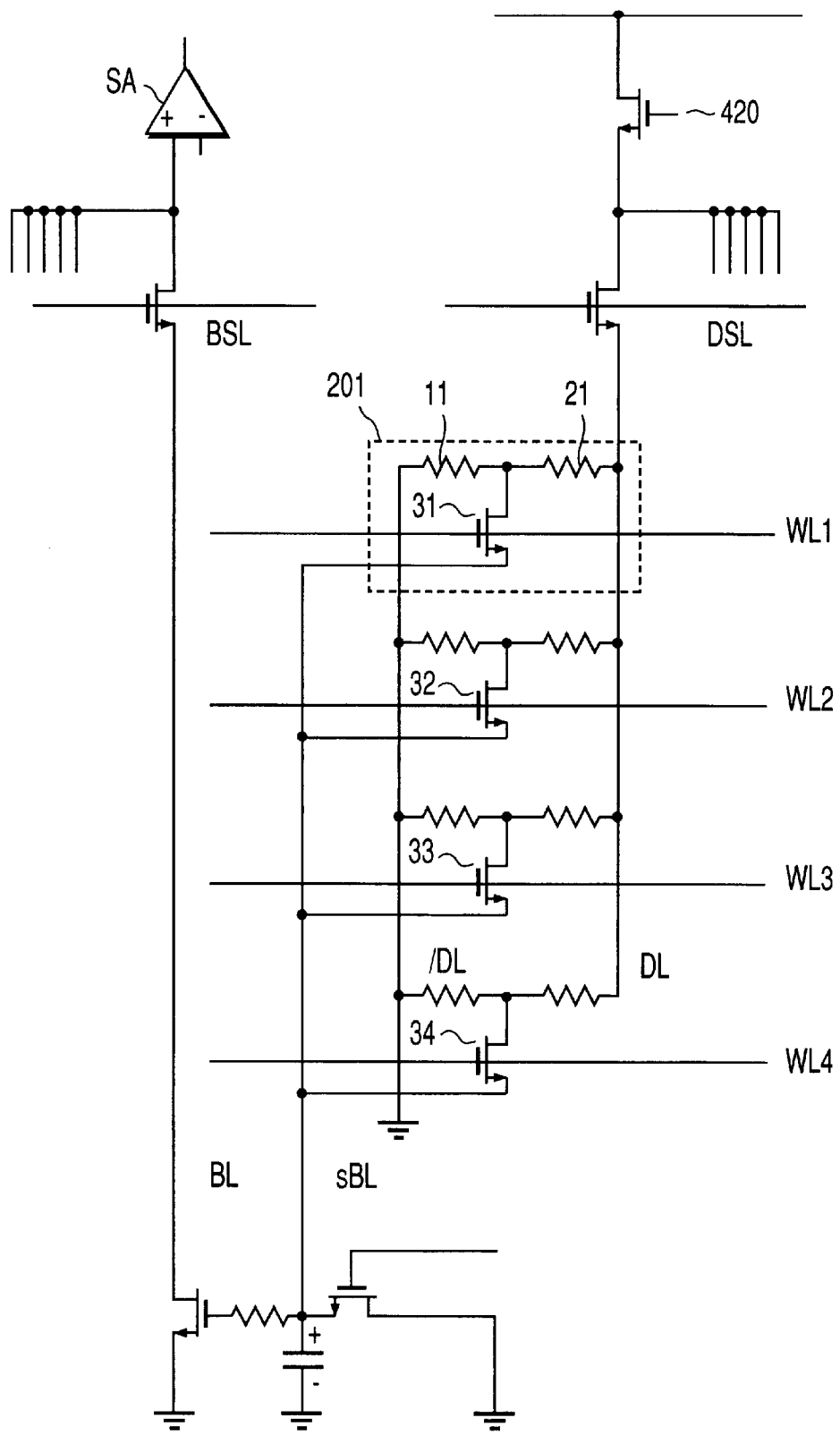
F I G. 30

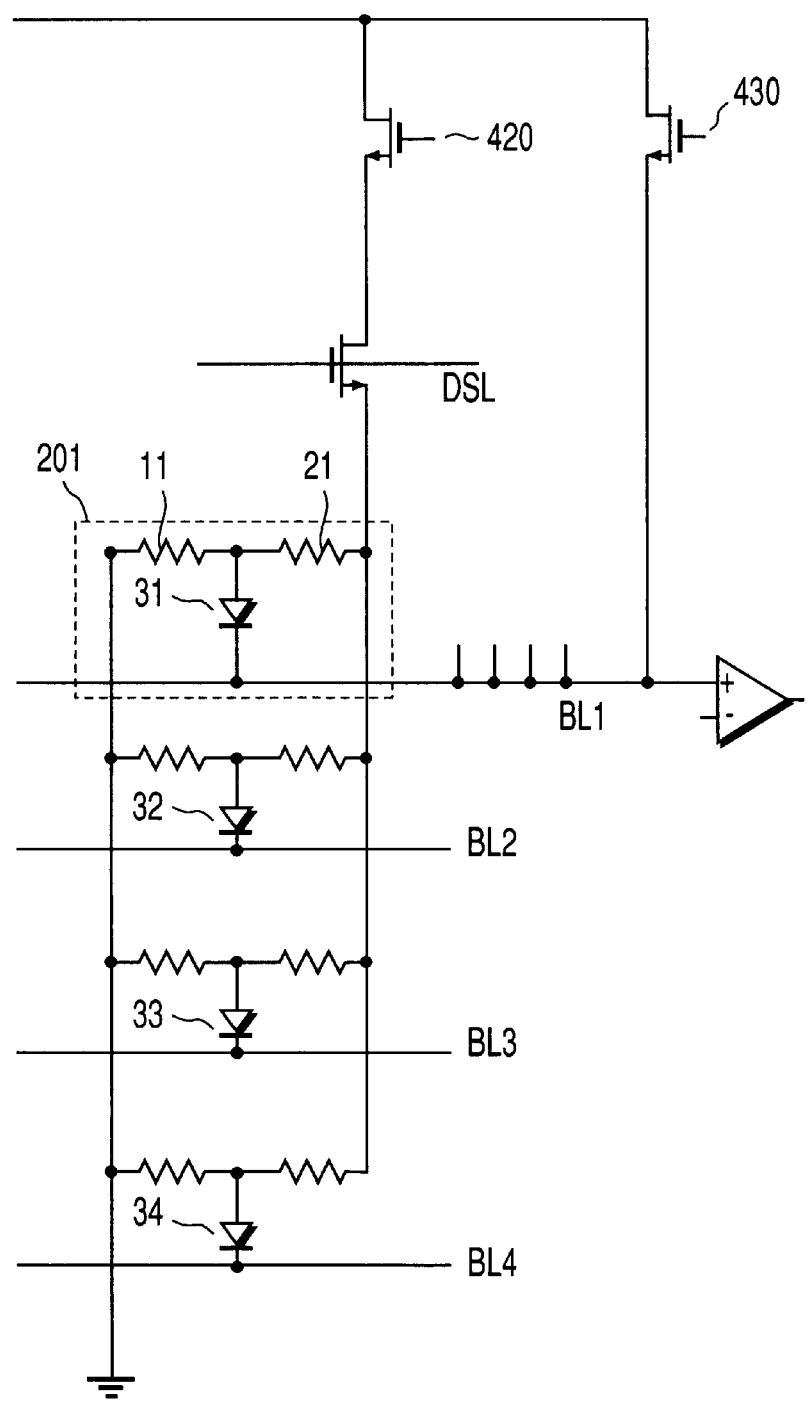
F I G. 33

MAGNETIC MEMORY DEVICE

CROSS-REFERENCE TO RELATED APPLICATIONS

This application is based upon and claims the benefit of priority from the prior Japanese Patent Applications No. 11-357469, filed Dec. 16, 1999; No. 2000-075168, filed Mar. 17, 2000; and No. 2000-344274, filed Nov. 10, 2000, the entire contents of which are incorporated herein by reference.

BACKGROUND OF THE INVENTION

The present invention relates to an information recording technique using a ferromagnetic material, particularly to a magnetic memory device utilizing magnetic tunnel junction.

A magnetic random access memory (hereinafter, abbreviated as MRAM) is a type of a solid state memory that can rewrite, hold, and read out record information any time by utilizing a magnetization direction of the ferromagnetic material as an information recording medium. This MRAM records information by corresponding binary coded information "1" and "0" whether the magnetization direction of the ferromagnetic material is parallel to or anti-parallel to a reference direction.

Recording information is written by switching the magnetization direction of the ferromagnetic material of each cell by a magnetic field generated by supplying a current to a write line disposed in a cross stripe shape. The power consumption during storing is principally zero.

Stored information is read out by utilizing a phenomenon in which the electric resistance of a memory cell changes depending on a relative angle between the magnetization direction of the ferromagnetic material that configures cells and a direction of a sense current or depending on a relative angle of magnetization between a plurality of ferromagnetic layers, so called the magnetoresistance effect.

The MRAM has the following advantages in comparison with a conventional semiconductor memory.

(a) Completely non-volatile. $10^{15}$ or more endurance cycles are possible.

(b) Nondestructive readout is possible, and refresh operation is not required, thus making it possible to reduce a readout cycle.

(c) The durability against radiation is strong in comparison with a charge storage type memory cell.

The degree of integration per a unit area for the MRAM and the write and readout times are expected to be approximately equal to those of the DRAM. Therefore, it is further expected to apply the MRAM to an external memory device for a portable digital audio instrument, a wireless IC card, and a mobile personal computer (PC) by utilizing significant non-volatile characteristics.

In an MRAM having its recording capacity of 1 Mb that is currently discussed for practical use, a Giant Magnetoresistance (hereinafter, abbreviated as a GMR effect) is employed for reading out stored information. An example of such an MRAM cell using an element that indicates the GMR effect (hereinafter, abbreviated as the GMR element), is disclosed in IEEE Trans. Mag., 33,3289 (1997)).

A value of the GMR effect of the tri-layered film made of a non-coupling NiFe/Cu/Co is about 6% to 8%. For example, in the aforementioned MRAM cell using the PseudoSpin-Valve structure, the distribution of the magnetic direction during readout of recorded information is controlled, whereby the resistance change of 5% or more is effectively obtained. However, in general, the sheet resistance of the GMR element is about some tens $\Omega/\mu m^2$. Therefore, even in the case where the sheet resistance of 100 $\Omega/\mu m^2$ and the resistance change rate of 5% are assumed, the output signal relevant to a sense current of 10 mA is merely 5 mV. Currently, in a MOS type field effect transistor that is practically available for use, the value of a source/drain current Ids is proportional to a rate between a channel width W and a channel length L, and the value of Ids when W=3.3 $\mu m$ and L=1 $\mu m$ is about 0.1 mA. Therefore, the value of the sense current of 10 mA used here is very excessive relevant to a transistor with sub-micron dimensions.

In order to solve this problem, in the MRAM cell using the GMR element, there is employed a method of connecting a plurality of GMR elements in series, and then, configuring a data lie (for example, refer to IEEE Trans. Comp. Pac. Manu. Tech. pt. A, 17,373 (1994).). However, in the case where memory cells are connected in series, there is a disadvantage that the power consumption efficiency during readout is greatly lowered.

In order to solve these problems, there is proposed an attempt to apply a ferromagnetic tunnel effect (Tunnel Magnetoresistance: hereinafter, abbreviated as a TMR effect) instead of the GMR effect. An element indicating the TMR effect (hereinafter, abbreviated as the TMR element) is primarily composed of a tri-layered film made of a ferromagnetic layer 1, an insulating layer, and a ferromagnetic layer 2, and current tunnels through the insulating barrier. The tunnel resistance value changes in proportion to a cosine of a relative angle in magnetization of both of the ferromagnetic metal layer, and an maximum value is obtained in the case where one magnetization is antiparallel to another.

For example, in tunnel junction of NiFe/Co/Al$_2$O$_3$/Co/NiFe, the magnetoresistance ratio exceeding 25% in a low magnetic field of 50 Oe or less is found out (for example, refer to IEEE Trans. Mag., 33,3553 (1997)). The cell resistance value of the TMR element is typically between $10^4$ ohms and $10^6$ $\Omega$ per a junction area ($\mu m^2$). Therefore, assuming that the resistance value is 10 k$\Omega$, and the magnetoresistance ratio is 25% in a cell of 1 $\mu m^2$, a cell readout signal of 25 mV is obtained in a sense current of 10 $\mu$A.

In an MRAM cell array using the TMR element, a plurality of TMR elements are connected in parallel on a data line. The following detailed structures are adopted.

(1) A structure in which a selection semiconductor element is disposed in series at each TMR element;

(2) A structure in which a selection transistor is disposed for each data line where a plurality of TMR elements are connected in parallel; and (3) A structure in which a plurality of TMR elements are disposed in matrix, and a selection transistor is disposed for each row data line or each column data line (for example, refer to J. Appl. Phys., 81,3758 (1997)).

Among these structures, the structure of (1) has the most excellent characteristics in an aspect of power consumption efficiency during cell output voltage readout.

However, in the MRAM cell array having the structure of (1), it is required to supply a current to a semiconductor element connected to the TMR element during readout. As a semiconductor element, there are employed: a MOS type transistor; a diode element using the transistor; and a diode element using pn junction or Schottky junction. Therefore, in the case where there occurs dispersion in characteristics of these semiconductor elements, noise caused by such dispersion cannot be ignored.

For example, in the case of a MOS transistor, a voltage drop between a source and a drain reaches 100 mV or more in a rule of 0.25 μm. That is, if there exists a dispersion of 10% in characteristics of a semiconductor element, noise of 10 mV or more is generated by such dispersion. In addition, in consideration of a noise generated at a peripheral circuit such as noise coupled with data line or noise due to dispersion in characteristics of the sense amplifier, the noise level is greater than 10 mV. In a current cell output voltage of about 20 mV to 30 mV, an only signal-to-noise ratio of some decibels can be obtained.

In order to improve the signal-to-noise ratio, in a conventional MRAM cell array, there is often employed a method for comparing an output voltage V of a selected single memory cell with a reference $V_{REF}$, thereby differentially amplifying a differential voltage $V_{sig}$ therebetween. A first object of this is to eliminate noise generated in a data line pair to which a memory cell connects, and a second object of this is to eliminate an offset of a cell output voltage $V_{sig}$ due to dispersion in characteristics of the semiconductor element for driving a sense line or selecting a cell. As a circuit for generating the reference voltage $V_{REF}$, there are employed a circuit using the semiconductor element or dummy cell. However, in this method, the selected memory cell and the circuit for generating the reference voltage are connected to their respective cell selection semiconductor elements, making it impossible to completely eliminate an offset of the cell output voltage V due to dispersion in characteristics of the semiconductor element.

Further, in the prior art, in general, the reference voltage $V_{REF}$ is defined as an intermediate voltage between output voltages $V_F$ and $V_{AF}$ that correspond to cell information "1" and "0". For example, in the case of current sensing or voltage detection, assuming that the sense current value is defined as $I_S$, the resistance value of the TMR element used for a cell is defined as R, and the magnetoresistance change ratio is defined as MR, $V_F$ and $V_{AF}$ can be obtained as follows.

$$V_F = R(1-MR/2) \times I_s \quad (1)$$

$$V_{AF} = R(1-MR/2) \times I_s \quad (2)$$

Assuming that the reference voltage is defined as an intermediate voltage between $V_F$ and $V_{AF}$, the differential voltage inputted to a sense amplifier is as follows.

$$V_{sig} = R \times MR \times I_s/2 \quad (3)$$

A factor of 2 in the denominator is due to the reference voltage $V_{REF}$ is set to the intermediate voltage. In the case of voltage sensing and current detection, assuming that a bias voltage is defined as $V_{bias}$, and a detection load resistance is defined as $R_L$, similarly, the following formulas can be obtained.

$$V_F = V_{bias} \times RL/R(1-MR/2) \quad (4)$$

$$V_{AF} V_{bias} \times R_L/[R(1+MR/2)] \quad (5)$$

$$V_{sig} = V_{bias} \times R_L/R \times MR/2 \quad (6)$$

In the deriving process of formula (6), the fact that MR 2<<1 is considered.

Therefore, in the prior art, only half of the magnetoresistance ratio of the TMR element can be utilized.

In order to solve these problems, for example, there is a method of using a magnetic field during read out by employing a TMR element in which a ferromagnetic layer 1 and a ferromagnetic layer 2 are ferromagnetically or anti-ferromagnetically coupled with each other (for example, refer to U.S. Pat. No. 5,734,605). However, this method is not suitable to application to a hand held device because power consumption during readout increases.

In addition, there is disclosed a method of disposing selection transistors for two TMR elements, respectively, thereby configuring a memory cell (for example, refer to ISSCC 2000 Digest paper TA7.2). In this method, writing is performed while the magnetization directions of the recording layers of two TMR elements are always anti-parallel to each other. That is, there is employed complementary write-in in which a magnetization configuration of either of the elements enters an anti-parallel state, and the magnetization of the other one enters a parallel state. In this method, outputs of these two elements are differentially amplified, thereby eliminating noise in the same phase, and improving the S/N. However, there is a problem that a cell area increases, and the degree of integration is lowered because two selection transistors are employed for a cell.

As described above, a TMR element is applied to a memory cell, whereby reduction of the sense current during readout and an increase in the cell output signal can be achieved at the same time, making it possible to provide an MRAM with its higher density than an MRAM using a conventionally employed GMR effect. However, even in the case where the TMR element is used for a memory cell, the cell output voltage is about some tens mV. In view of the magnitude of noise caused by dispersion in characteristics of semiconductor elements for driving a sense line or selecting a cell or the magnitude of noise from a data line and a periphery circuit, a sufficient signal-to-noise ratio is not obtained currently. In order to improve the signal-to-noise ratio, there is proposed a method using a magnetic field; and however, there is a disadvantage that power consumption during readout increases.

BRIEF SUMMARY OF THE INVENTION

It is an object of the present invention to provide a magnetic memory device capable of increasing a cell output voltage during readout, and capable of improving a signal-to-noise ratio without causing an increase in power consumption during readout, the magnetic memory device being compatible with low power consumption and fast reading properties.

According to the present invention, there is provided a magnetic memory cell device comprising a plurality of tunnel junction sections that stack a pinned layer having its magnetization direction pinned therein and a recording layer having its magnetization direction changed by an external magnetic filed, and that configures single or double and more tunnel junction, wherein a memory cell that is an information recording unit is composed of two tunnel junction sections (first and second TMR elements), a first end in the stack direction of each of the first and second TMR elements is connected to each of the data lines, and a second end is connected to a bit line via the same cell selection semiconductor element.

In addition, according to the present invention, there is provided a magnetic memory cell device comprising a plurality of tunnel junction sections that stack a pinned layer having its magnetization direction pinned therein and a recording layer having its magnetization direction changed by an external magnetic filed, and that configures single or multi tunnel junctions, wherein the magnetic memory cell array is divided in a plurality of divided cell arrays, each divided cell array is made of first and second data lines disposed in parallel to each other, a plurality of word lines crossing these data lines, a bit line running in parallel to the data lines, and a plurality of magnetic memory cells. The magnetic memory cell is composed of two tunnel junction sections (first and second TMR elements), the first ends of the first and second TMR elements in the stack direction are connected to the first and second data lines, respectively, and the second ends are connected to the same bit line via the same cell selection semiconductor element.

Furthermore, according to the present invention, there is provided a magnetic memory cell device comprising a plurality of tunnel junction sections that stack a pinned layer having its magnetization direction pinned therein and a recording layer having its magnetization direction changed by an external magnetic filed, and that configures single or double and more tunnel junctions, wherein the magnetic memory cell array is divided in a plurality of divided cell arrays, each divided cell array being made of first and second subsidiary data lines disposed in parallel to each other, a plurality of word lines crossing these subsidiary data lines, a subsidiary bit line running in parallel to the subsidiary data lines, and a plurality of magnetic memory cells. The magnetic memory cell is composed of two tunnel junction sections (first and second TMR elements). The first ends of the first and second TMR elements in the stack direction are connected to the first and second subsidiary data lines, respectively. The second ends are connected to the same subsidiary bit line via the same cell selection semiconductor element. The first and second subsidiary data lines and a subsidiary bit line are connected to the first and second data lines and the bit line via a selection transistor, respectively.

Desired embodiments of the present invention are exemplified as follows.

(1) The resistance values and the magnetoresistance ratio of the first and second tunnel junction sections are substantially equal to each other, and the magnetization configuration of the both recoding layers of the tunnel junction sections is always in anti-parallel.

(2) One end of each of the first and second TMR elements is connected to each of the first and second data lines, and the other end is connected to a bit line via the cell selection semiconductor element.

(3) The stored information is read by comparing the magnitude of currents that flow the first and second data lines when a potential difference is applied between the first and second data lines and the bit line. In addition, the first and second data lines are kept at equal potentials.

(4) The stored information is read by comparing the magnitude of a voltage that appears in a bit line when a potential difference is applied between the first and second data lines.

(5) A first write line is disposed at one end in the stacking direction of the first TMR element, and a second write line is disposed at one end in the stacking direction of the second TMR element. Common write lines are disposed at the first or second end of the first TMR element in the stacking direction and at the first or second end of the second TMR element in the stacking direction. These common write lines are configured so as to be diagonal to the direction in which a current flows the first write line and the direction in which a current flows the second write line.

(6) The first and second TMR elements are disposed in the same plane. The first and second write lines are disposed in parallel to each other in the same plane. A third write line and the first and second write lines are in another plane, and are disposed so as to cross each other in the vicinity of the first and second TMR elements. Each of the first and second write lines is connected to the outside of a memory cell array region at one end.

(7) The first and second TMR elements are arranged in vertical direction, and the first and second write lines are disposed in parallel to the vertical direction. The third write line and the first and second write lines are disposed in parallel to each other in vertical direction in a plane. The third write line and the first and second write lines are in another plane, and are disposed so as to cross each other in the vicinity of the first and second TMR elements. Each of the first and second write lines is connected to the outside of a memory cell array region at one end.

(8) A cell selection semiconductor element is a MOS type field effect transistor, a diode element using a MOS type field effect transistor or a junction type diode element that employs pn junction or Schottky junction.

(9) The number of memory cells included in one subsidiary cell array is 1000 or less.

In the above arranged magnetic memory device, a method of reading stored information relevant to a memory cell first includes: activating a cell selection semiconductor element in a low impedance state during readout; and comparing the magnitude of currents that flows the first and second data lines when a potential difference is applied between the first and second data lines and the bit line. The first and second data lines are controlled so as to be the same potential. In this manner, the senses currents that depend on the potential difference and the resistance value of each TMR element flows the first and second data lines. The resistance values of the TMR elements are different from each other depending on whether a relative angle in magnetization between the pinned layer and the storage layer of the TMR element is parallel to or is anti-parallel to another.

In the magnetic memory device according to the present invention, the resistance values and magnetoresistance ratio of the two TMR elements are equal to each other, and the magnetization directions of the respective recording layers are anti-parallel to each other. Therefore, assuming that the potential difference is defined as $V_{bias}$, the resistance value of the first TMR element is defined as R (1−MR/2), and the resistance value of the second TMR element is defined as R (1+MR/2), the values $I_1$ and $I_2$ of the sense currents that flow the first and second data lines are as follows.

$$I_1 = V_{bias}/R(1-MR/2) \tag{7}$$

$$I_2 = V_{bias}/R(1+MR/2) \tag{8}$$

That is, a sense current difference $I_{sig}$ is obtained by $I_{sig}=V/R \times MR$, where a greater differential signal than that of the prior art can be obtained. A memory cell is a current driven element. Thus, if there occurs a dispersion in resistance when a cell selection semiconductor connected to the TMR element in serial, the result is a dispersion in output signals. In the present invention, the first and second TMR elements share the same cell selection semiconductor element, thus making it possible to completely eliminate a dispersion caused by dispersion in characteristics of the semiconductor element. This is a great advantage that the prior art does not have.

In addition, the above reading method secondly include: activating a cell selection semiconductor element in a low impedance state during readout; and comparing the magnitude of a voltage that appears in the bit line when the potential difference is applied between the first and second data lines. Assuming that the potential difference between the first and second data lines is defined as $V_{bias}$, the resistance value of the first TMR element is defined as R (1−MR/2), the resistance value of the second TMR element is defined as R (1+MR/2), a potential difference V between the second data line and the bit line is obtained as follows.

$$V = V_{bias}/2 \times (1+MR/2) \tag{9}$$

Therefore, when the reference voltage VREF is set to:

$$V_{REF} = V_{bias}/2 \tag{10}$$

the signal voltage $V_{sig}$ is obtained as follows.

$$V_{sig} = V_{bias}/2 \times MR/2 \tag{11}$$

In this reading method, although the change of the signal voltage is smaller than that in the first reading method because a reference voltage is used, the following advantageous effects are provided.

(1) The differential voltage is no dependence on a current value that flows a TMR element. That is, even in the case where the number of memory cells in a memory cell array changes, and then, an impedance between a data line changes, the output is not affected.

(2) A bias voltage is divided by two TMR elements, and thus, the reduction of the magnetoresistance ratio depending on the applied voltage can be mitigate.

(3) Almost no current flows a bit line, and thus, dispersion in characteristics of the selection semiconductor element can be eliminated.

In the magnetic memory device according to the present invention, storage information is written into a memory cell by supplying a current to the first, second, and third write lines. In this duration, the value of a magnetic field is set so as to exceed that of the switching field of the TMR element only in a cross region for the first, second, and third write lines, whereby cell selection during write can be achieved.

In the magnetic memory device according to the present invention, the direction of a current that flows the first write line disposed at the first TMR element is opposite to the direction of a current that flows the second write line disposed at the second TMR element. That is, in the magnetic memory device according to the present invention, the magnetization directions of the recording layers of the first and second TMR elements that configure memory cells during write operation are always anti-parallel to each other. The information "1" and "0" are discriminated depending on whether a relative angle of magnetization between a pinned layer of the element and a storage layer is parallel or is anti-parallel relevant to the first TMR element.

According to the invention, there is provided a magnetic memory device comprising a tunnel junction section including a magnetic memory layer formed of a stack of a first pinned layer having the magnetization direction pinned therein, a first tunnel barrier adjacent to the first pinned layer, a first magnetic layer which is opposite to the first pinned layer via the first tunnel barrier and in which a magnetization direction changes depending on an external magnetic field, a second magnetic layer which is anti-ferromagnetically coupled to the first magnetic layer and in which a magnetization direction changes depending on the external magnetic field, and a non-magnetic conductive layer interposed between the first and second magnetic layers, for anti-ferromagnetically coupling between the first and second magnetic layers, a second tunnel barrier adjacent to the second magnetic layer, and a second pinned layer opposite to the second magnetic layer via the second tunnel barrier, and a detection section configured to detect a current difference between a first tunnel current flowing across the first magnetic layer and the first pinned layer and a second tunnel current flowing across the second magnetic layer and the second pinned layer or a voltage difference in a differential scheme.

According to the invention, there is provided a magnetic memory device comprising a tunnel junction section including: a magnetic memory layer formed of a stack of a first pinned layer having the magnetization direction pinned therein, a first tunnel barrier adjacent to the first pinned layer, a first magnetic layer which is opposite to the first pinned layer via the first tunnel barrier and in which a magnetization direction changes depending on an external magnetic field, a second magnetic layer which is anti-ferromagnetically coupled to the first magnetic layer and in which a magnetization direction changes depending on the external magnetic field, and a non-magnetic conductive layer interposed between the first and second magnetic layers, for anti-ferromagnetically coupling between the first and second magnetic layers, a second tunnel barrier adjacent to the second magnetic layer, and a second pinned layer opposite to the second magnetic layer via the second tunnel barrier, a bit line electrically connected to all or either of the first magnetic layer, non-magnetic conductive layer, and second magnetic layer, a first data line electrically connected to the first pinned layer, and a second data line electrically connected to the second pinned layer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a view showing a change in values $I_1$ and $I_2$ of currents that flow data lines DL and /DL according to the first embodiment;

FIG. 3 is a chart depicting waveforms when record information on a plurality of memory cells is continuously read out according to the first embodiment;

FIG. 6 is a view schematically illustrating disposition of a TMR element and a write line that configure the magnetic memory cell array according to the first embodiment;

FIG. 7 is a view showing a planar structure of a memory cell used for the first embodiment;

FIG. 13 is a view schematically illustrating disposition of the TMR element and write element that configure a magnetic memory cell array according to a third embodiment;

FIG. 23 is a view showing an electrical equivalent circuit of a magnetic memory cell array according to a twelfth embodiment;

FIG. 24 is a view showing an electrical equivalent circuit of a magnetic memory cell array according to a thirteenth embodiment;

FIG. 29 is a view showing an electrical equivalent circuit of a magnetic memory cell array according to an eighteenth embodiment;

FIG. 30 is a view showing an electrical equivalent circuit of a magnetic memory cell array according to a nineteenth embodiment;

FIG. 33 is a view showing an electrical equivalent circuit of a magnetic memory cell array according to a twenty-first embodiment;

DETAILED DESCRIPTION OF THE INVENTION

Hereinafter, the present invention will be described in detail by way of present embodiments.

(First Embodiment)

Figure 1:
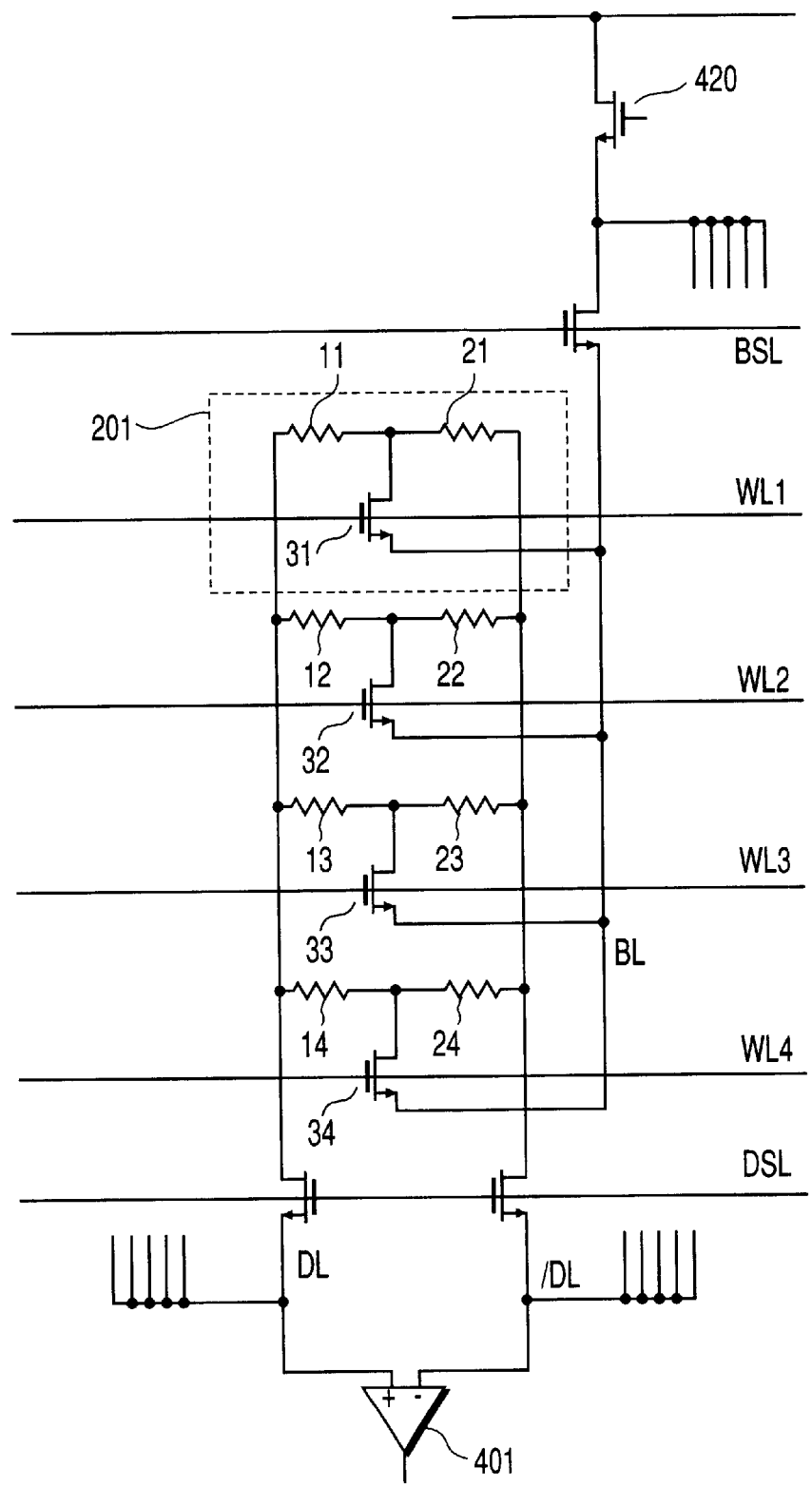
FIG. 1 is a view showing an electrical equivalent circuit of a magnetic memory cell array according to a first embodiment.

FIG. 1 is a view showing an electrical equivalent circuit of a magnetic memory cell array according to a first embodiment of the present invention.

In the figure, a region enclosed by dashed line corresponds to a memory cell 201, and this memory cell 201 is fabricated by two TMR elements and a selection transistor. That is, the first memory cell is fabricated by TMR elements 11 and 21 and a selection transistor 31; the second memory cell is fabricated by TMR elements 12 and 22 and a selection transistor 32; the third memory cell is fabricated by TMR elements 13 and 23 and a selection transistor 33; and the forth memory cell is fabricated by TMR elements 14 and 24 and a selection transistor 34. In the figure, although four memory cells are arranged relevant to a data line direction which will be described later, the number of arranged memory cells can be, of course, changed as required.

In the first memory cell 201, one end of each of the two TMR elements 11 is connected to a data line DL, and one end of the TMR element 21 is connected to a data line /DL. The other end of each of the TMR elements 11 and 21 is connected to the same bit line BL via the cell selection transistor 31. In the other cells as well, similarly, one end of the TMR element is connected to each of the data lines DL and /DL, and the other end is connected to the same bit line BL via cell selection transistors (32 to 34).

Independent word lines WL1 to WL4 are disposed respectively at the selection transistors 31 to 34. As described later, the adjacent memory cell arrays share a drain region of the selection transistors and a bit line. The data lines DL and /DL are connected to a current detection type differential amplifier 401 via a selection transistor having a common word line DSL. A bias voltage clamping circuit 420 is connected to the bit line BL via a selection transistor having a word line BSL connected thereto.

Next, an operation of this circuit will be described by exemplifying a memory cell 201.

Now, consider a case in which the magnetization configurations of the record layer and pinned layer of the TMR element 11 are parallel to each other, and those of the TMR elements 21 are anti-parallel to each other (record information "1"). In an initial state, the potentials of WL1, BSL, and DSL are 0. Then, the potentials of DSL and BSL are defined as $V_{DD}$, DL and /DL are set to a zero potential, and $V_{bias}$ is applied to BL. In this state, when WL1 is set to $V_{DD}$, the selection transistor 31 is electrically conductive. Assuming that the resistance value of the TMR element 11 is defined as R (1−MR/2) and the resistance value of the TMR element 21 is defined as R (1+MR/2), the sense currents $I_1$ and $I_2$ that flows the data line DL and /DL are as follows.

$$I_1 = V_{bias}/R\ (1-MR/2) \tag{12}$$

$$I_2 = V_{bias}/R(1+MR/2) \tag{13}$$

That is, the result is $I_1 > I_2$, and the difference is $I_{sig} = V/R \times MR$. In the case of the record information "0", i.e., in the case where the magnetization configurations of the TMR elements 11 is anti-parallel to each other, and those of TMR elements 21 are parallel to each other, $I_1$ and $I_2$ are as follows.

$$I_1 = V_{bias}/R(1+MR/2) \tag{14}$$

$$I_2 = V_{bias}/R(1-MR/2) \tag{15}$$

That is, the result of $I_1 < I_2$, and the difference is equal to a case of record information "1". Therefore, the magnitudes of $I_1$ and $I_2$ are compared by means of the current detection type differential amplifier 401, thereby making it possible to read out information.

FIG. 2 shows a change in the currents $I_1$ and $I_2$ that flows data lines DL and /DL as a change with an elapse of time. Here, the bias voltage $V_{bias}$ is 400 mV; the resistance values of the TMR elements 11 and 21 are 40 kΩ in a parallel state with a predetermined bias, and are 60 kΩ in an anti-parallel state. The potential WL1 is held in a period $V_{DD}$ of 5 ns to 10 ns. As described above, it is found that sense currents with different values flow the data lines DL and /DL according to the element resistance value. A slight time delay is occurred due to the stray capacitance of the data lines.

FIG. 3 shows waveforms when record information on a plurality of memory cells is continuously read out. In this embodiment, since data lines DL and /DL with low impedance are current driven, as shown in FIG. 2, the delay due to the stray capacitance of the data lines is as small as 0.5 ns or less. Such high speed readout characteristic is an great advantage of the present invention.

Figure 4:
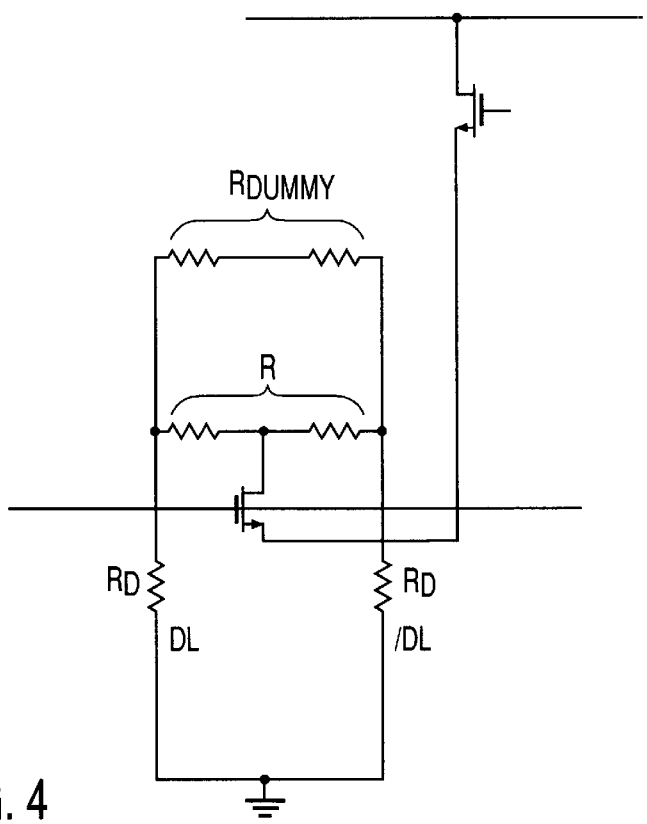
FIG. 4 is a diagram of the equivalent circuit presumed an element other than a selection cell as a short-circuit resistor.

In the present embodiment, an unselected cell serves as a shunt resistor between the data lines DL and /DL, and its resistance value is 2R irrespective of storage information. For example, in the case in which N+1 cells are connected to the data lines DL and /DL, its equivalent circuit is as shown in FIG. 4. In this circuit, a connection between the data lines DL and /DL is short-circuited by a resistor of 2R/N. While sense currents flow from the selection cell to the data lines DL and /DL, a potential difference is slightly produced with the data lines DL and /DL by a wiring resistance $R_D$ of the data lines DL and /DL, whereby a current flows a short-circuit resistor $R_D$. As a result, the potential difference acts in a direction in which the current difference between the data lines DL and /DL is eliminated.

Figure 5:
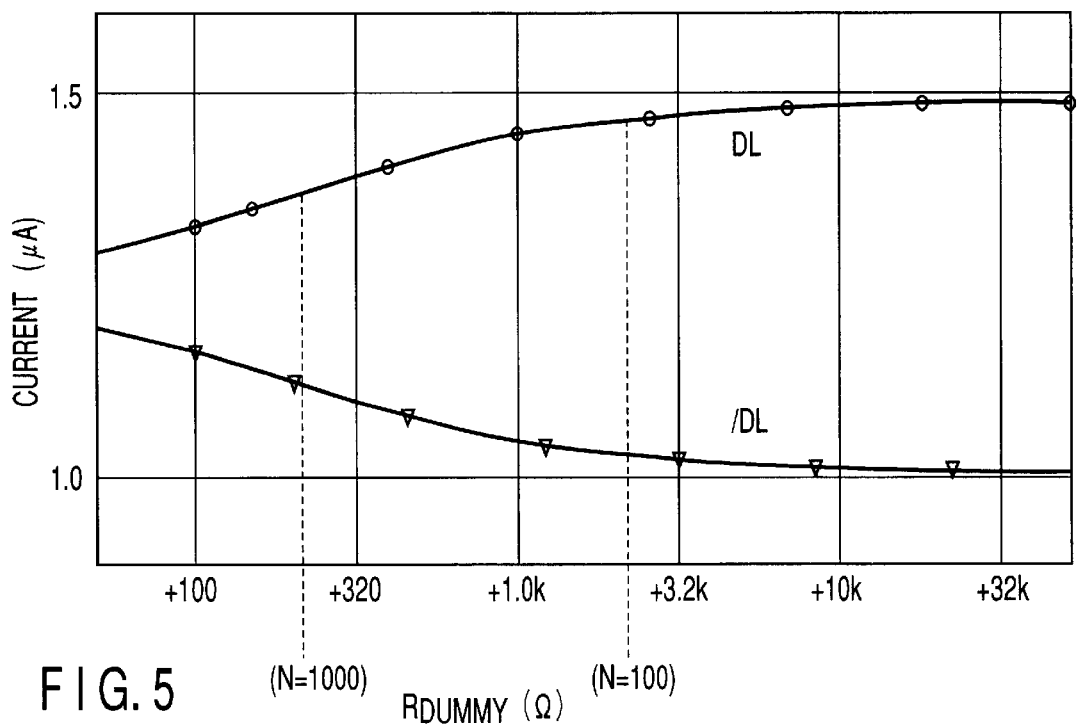
FIG. 5 is a view showing the result of simulation using the equivalent circuit shown in FIG. 4.

FIG. 5 shows the result of simulation using the equivalent circuit shown in FIG. 4. Here, R=250 kΩ is presumed. When the magnitude of the short-circuit resistance $R_{dummy}$ is 2.5 kΩ, i.e., when the number of connection cells is N=100, a decrease in the current difference is within 10%, which does not cause any practical problem. However, there will be lost an advantage of the present invention that, when the number of connection cells is N=1000, a decrease in current difference exceeds 50%, and an output signal increases by two times due to complementary readout. Therefore, in the present embodiment, the number of memory cells per cell block is preferably 100 or less, and is required to be 1,000 at most.

FIG. 6 is a view schematically illustrating disposition of a TMR element and a write line that configure the magnetic memory array according to the present embodiment. In FIG. 6, reference numerals 10 to 14 and reference numerals 20 to 24 denote TMR elements, and reference numerals 51 and 52 denote write lines. For a better understanding of the invention, a structure other than those of the TMR elements and write lines is omitted here. In the figure, an area enclosed by dashed line indicates the memory cell 201. In the figure, although five memory cells are arranged along in a direction in which write lines 51 are arranged, the number of this arrangements can be changed as required.

The memory cell 201 includes two TMR elements (first and second TMR elements 11 and 12), and the write lines 51 and 52 cross each other vertically in their respective element regions. The TMR elements 11 and 21 configure a single or double and more tunnel junctions as described later, and have a pinned layer in which the magnetization direction is pinned; and a recording layer in which the magnetization direction changes. In addition, these elements are manufactured so that the resistance values, the magnetoresistance ratio, and the switching field of the recording layer are equal to each other in both of the elements. The write line 51 has a folded U-letter shape, and is disposed so that the current flowing direction is reversed relevant to the TMR elements 11 and 21.

Recording information is written into the memory cell 201 by using the write lines 51 and 52. Now, assuming that a potential of one end 511 of the write line 51 is set to be higher than the other end 512, a write current flows the write line 51 as indicated by the arrow. The direction of the write current is at the upper right of a paper face relevant to the TMR element 21, and is at the lower left of a paper face relevant to the TMR element 11. By this write current, the magnetic field in the direction indicated by the arrow shown by dashed line in the figure is produced around the write line, and however, its orientation is at the left of a paper face relevant to the TMR element 21, and at the right of a paper face relevant to the TMR 11. Therefore, by this magnetic field, the writing operation can be achieved such that the magnetization directions of the TMR elements 11 and 21 are always opposite to each other.

The information "1" and "0" may be discriminated depending on whether a relative angle between magnetization of the recording layer of the TMR element 11 and magnetization of the pinned layer is parallel or anti-parallel. In addition, the information "1" and "0" are easily rewritten by inverting a direction of a write current that flows the write line 51. In the write line 51, a first write line 51a is defined which connects to a terminal 511, and a second write line 51b is defined which connects to a terminal 512.

In order to select a cell during writing, a write line 52 (a third write line) is used together with the write line 51. That is, when a write current in the upper left direction of a paper face flows the write line 52 as shown, the magnetic field in a direction indicated by the arrow shown by dashed line in the figure is produced around the write line 52. The direction of the magnetic field from the write line 52 is identical to those of the TMR elements 11 and 21, and is vertical to the magnetic field direction from the write line 51. Therefore, the value of a write current that flows each of the write lines 51 and 52 is set so that the value of the composite magnetic field from the write lines 51 and 52 is greater than that of the inverted magnetic field, whereby cell selection and writing can be achieved.

In the writing operation using the magnetic fields orthogonal to each other as described above, it is preferable that the easy axis of magnetization of the recording layer of the TMR element is parallel to the magnetic field direction from the write line 51. In addition, the write lines 51 and 52 may not always be orthogonal to each other in the vicinity of the TMR element, and an arbitrary angle may be set.

FIG. 7 shows a planar structure of a memory cell 201 that corresponds to that shown in FIG. 1. The memory cell according to the present embodiment has two TMR elements in one structure, and the TMR elements are formed at an upper layer of the semiconductor circuitry on a Si substrate 70.

In FIG. 7, reference numerals 71 and 72 denote diffusion regions of a cell selection transistors which serve as drain or source of the transistor; reference numerals 41 and 42 denote data lines, reference numeral 30 denotes a word line of the cell selection transistor; reference numeral 44 denotes a cell plate formed at the lower layer of the TMR elements 11 and 12; reference numeral 45 denote a contact between the cell plate 44 and the drain region of the cell selection transistor. The source region 72 of the cell section transistor is shared with memory cells of the adjacent memory cell arrays (not shown), and is connected to a bit line. In consideration of an element separation region, the dimensions of one memory cell range from 20 to 25F$^2$. Here, F denotes a data line interval.

In the present embodiment, two TMR elements share one transistor, thus making it possible to reduce a cell region twice in comparison with a differential amplifier in which two TMR elements have their own transistors.

Figure 8A:
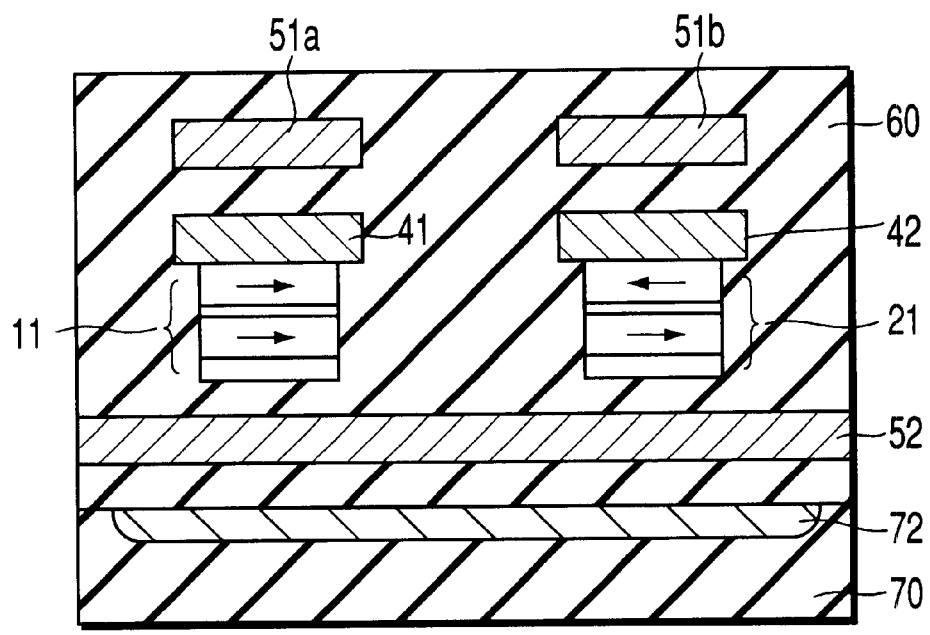
FIGS. 8A and 8B are views showing cross sections taken along the lines 8A—8A and 8B—8B in the memory cell structure shown in FIG. 7.
Figure 8B:
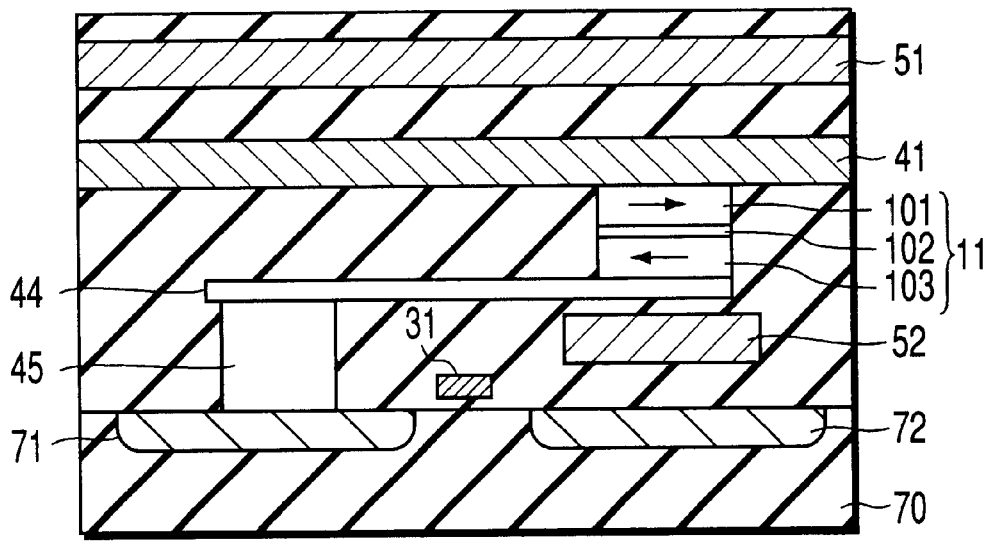

FIGS. 8A and 8B are schematic views showing cross sections taken along the lines 8A—8A and 8B—8B in a planar structure of the memory cell shown in FIG. 7. The semiconductor circuit section formed on a Si substrate 70 and each metal layer is separated by an interlayer insulation layer 60. The TMR elements 11 and 21 each are composed of a stack of a record layer 101, a tunnel barrier 102, and a pinned layer 103. The TMR elements 11 and 21 are formed on a common cell plate 44. The cell plate 44 is formed to ensure electrical contact between a cell selection transistor and each of the TMR elements 11 and 21. This node is made of non-magnetic conductive layer such as W, Al or Ta.

Figure 9A:
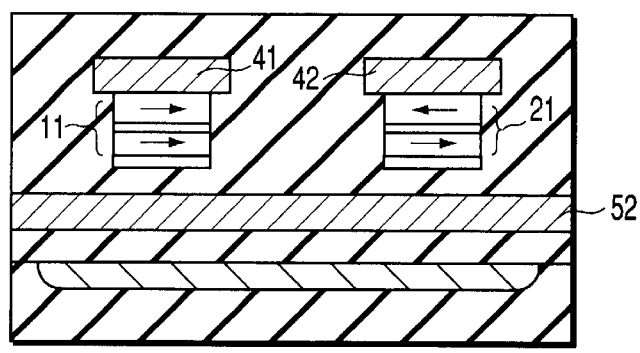
FIGS. 9A and 9B are views showing cross sections of the memory cell structure when the write line and the data line are used all together.
Figure 9B:
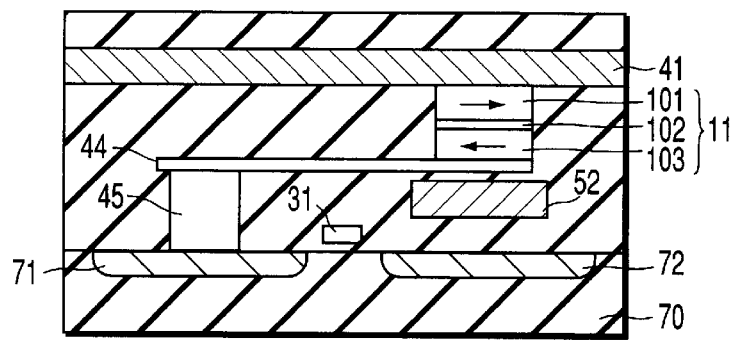

In the present embodiment, although there is illustrated a structure in which the write lines 51 and 52 are separated from the data lines 41 and 42, it is possible to share both of them as shown in FIGS. 9A and 9B, and to provide the data lines 41 and 42 with functions of the write line 51. In this case, a metal wiring layer that corresponds to the write line 51 shown in FIGS. 8A and BB is eliminated. In addition, in the above case, although the data lines 41 and 42 are required to be short-circuited at one end thereof during write operation, this short-circuit mechanism can be easily arranged by using a conventionally known circuit technology. Although the data lines 41 and 42 are connected to each other by a number of TMR elements, the junction resistance of the TMR element is sufficiently large in comparison with the wiring resistance of the data lines. Thus, even if a plurality of such elements are connected, the magnitude of a write current that flows through the TMR elements during writing can be ignored.

It is a preferred embodiment that a barrier metal formed of a conductive metal nitride such as TiN or TaN for preventing mutual metal diffusion is provided at the lower part of the cell plate 44 and at a contact site of the TMR element. In addition, a seed layer such as Au, Pt, Ta, Ti, or Cr may be provided in order to control crystallinity and crystal orientation of the pinned layer 103.

The pinned layer 103 is made of a thin layer made of Fe, Co, Ni or their alloy. The magnetization direction of the pinned layer defines a reference direction during information writing and readout. Therefore, the switching field is required to be sufficiently greater than that of the recording layer described later. For this purpose, for example, there is preferably employed: a stack made of metallic anti-ferromagnetic material such as Mn alloy and Fe, Co, Ni or their alloy; or an alternate stack made of Fe, Co, Ni or their alloy subjected to interlayer anti-ferromagnetic coupling and a non-magnetic metal such as Cu or Ru.

The tunnel barrier 102 is made of an Al oxide layer, and is formed on the pinned layer 103 by directly sputtering alumina, or by oxidizing, after an Al of 2 nm or less in thickness has been formed, the Al layer. A material used for the tunnel barrier 102 is required to have good insulation properties in very thin layer thickness of 2 nm or less. As such material, there can be used a $Ta_2O_5$, silicon oxide, silicon nitride, MgO and the like as well as the above alumina sputtered layer and Al oxidation layer. In addition, there can be provided a structure in which metal particles are dispersed in an insulation material, and further, a structure in which a very thin metal layer of several nm is sandwiched. When an insulating layer having these composite structures is used, the cell resistance value can be easily controlled by structural design, which is preferable in the practical point of view.

The recording layer 101 is formed of a thin layer made of Fe, Co, Ni or their alloy. In order to reduce power consumption during information writing, it is desirable that the switching field of the recording layer is as small as possible. The magnitude of the preferred switching field is 10 Oe to 30 Oe. For the purpose of reducing the switching field of the recording layer, it is a preferred embodiment to employ a layer that stacks a CoFe alloy layer having high spin polarization of conductive electron and a NiFe alloy layer having soft magnetic characteristics. In addition, an alloy or compound with Fe, Co, Ni and any other element may be employed.

Data lines 41 and 42 formed of a non-magnetic conductive layers such as W, Al or Cu or their alloy are disposed at the upper layer of the record layer 101. Alternatively, it is a preferred embodiment to provide a contact site with a barrier metal that is formed of a conductive metal nitride such as TiN or TaN, for example, for preventing mutual diffusions with these lines. For constituent elements other than TMR elements and a manufacturing method thereof, there can be employed a semiconductor element manufacturing technique which is conventionally known, and a detailed description is omitted here.

As described above, in the present embodiment, one memory cell (for example, reference numeral 201) is fabricated by two TMR elements (for example, reference numerals 11 and 21), each of memory cells is disposed at a cross point between each of the write lines 51a and 51b disposed in parallel to each other and the write line 52 orthogonal to these lines. Thus, a current is supplied to the write lines 51a and 51b and the write line 52, whereby writing can be selectively performed for an arbitrary memory cell.

The directions of currents that flow the write lines 51a and 51b are opposite to each other, and the magnetization directions of the storage layer 101 of the two TMR elements 11 and 21 that configures one memory cell are always anti-parallel to each other during write operation. Thus, the difference between outputs of the TMR elements 11 and 21 is obtained during storage information readout, whereby a great differential voltage can be obtained in comparison with that in the prior art. Specifically, when a cell selection transistor 31 is rendered conductive during readout, and a potential difference is applied between each of the first and second data lines DL and /DL and the bit line BL, the magnitudes of the currents $I_1$ and $I_2$ that flow the data lines DL and /DL are compared with each other by means of the current detection type differential amplifier 401, whereby storage information can be read out.

Therefore, according to the present embodiment, the cell output voltage can be increased, and a signal-to-noise ratio can be improved without causing an increase in power consumption during readout, making it possible to ensure compatibility between low power consumption and fast readout capability. In addition, the TMR elements 11 and 21 share the same cell selection transistor 31, thus making it possible to completely eliminate an offset of a cell output voltage due to dispersion in transistor characteristics.

(Second Embodiment)

Figure 10:
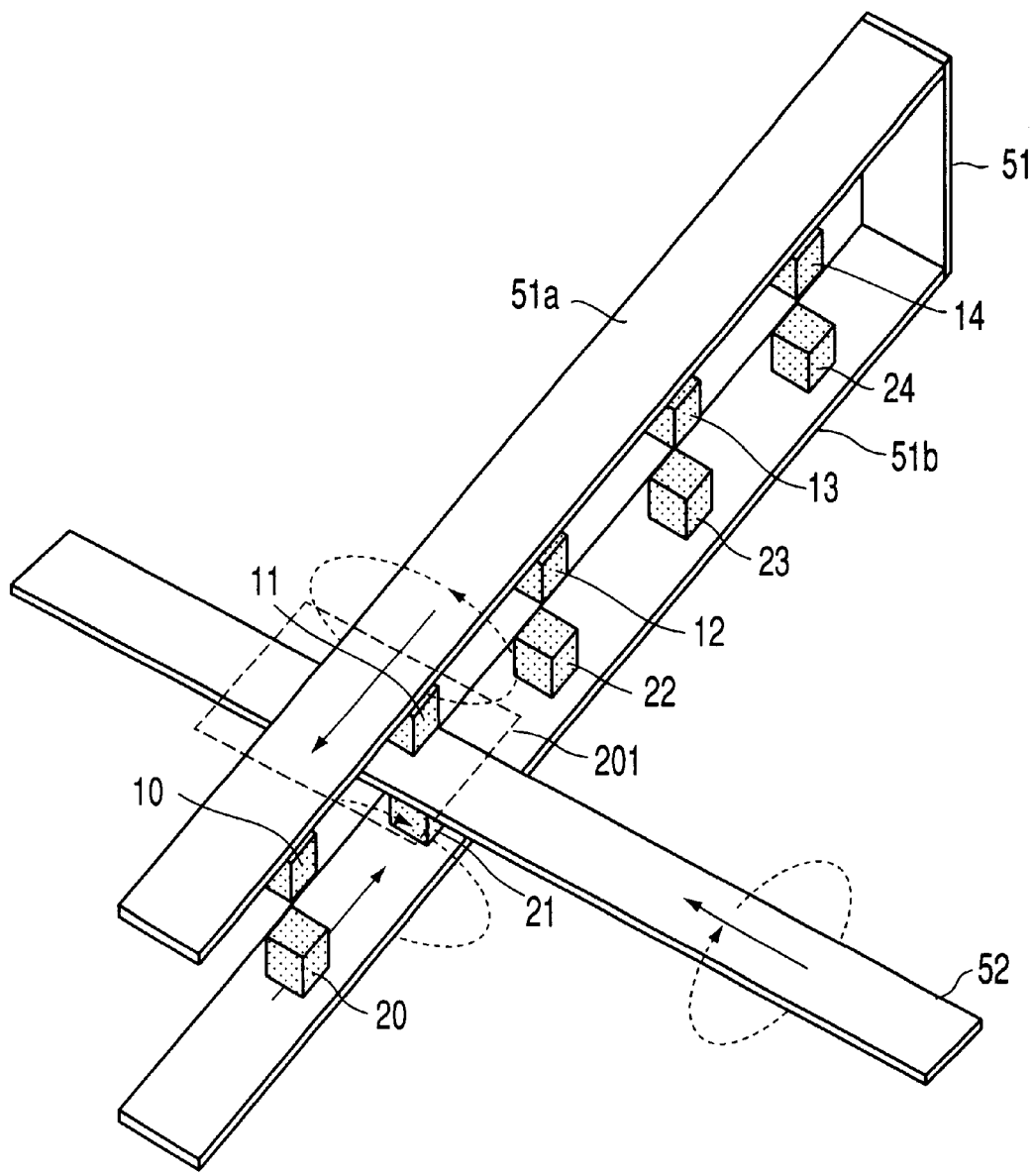
FIG. 10 is a view schematically illustrating disposition of the TMR element and write line that configure a magnetic memory cell array according to a second embodiment.

FIG. 10 is a view schematically illustrating disposition of a TMR element and a write line that configure the magnetic memory cell array according to a second embodiment of the present invention.

In FIG. 10, reference numerals 10 to 14 and reference numerals 20 to 24 denote TMR elements; reference numerals 51 and 52 denote write lines. For a better understanding, a structure other than those of the TMR elements and write lines is omitted. In the figure, an area enclosed by dashed line indicates a region of a memory cell 201 that is an information recording unit.

The memory cell 201 includes two TMR elements 11 and 21. Write lines 51 and 52 cross vertically in the respective element regions. The write line 51 has a folded U-letter shape in vertical direction, and is disposed so that the TMR elements 11 and 21 are opposite to each other in the current run direction. In the present embodiment, unlike the first embodiment, the TMR elements 11 and 21 and the write line 51 are disposed in the same plane in a direction vertical to the layer face.

That is, the write line 51 is formed of the first and second write lines 51a and 51b disposed in parallel to each other in vertical direction, and one end of each of the write lines 51a and 51b is connected at the outside of the cell disposition region. The TMR elements 10 to 14 are disposed respectively on the lower face of the write line 51a; TMR elements 20 to 24 are disposed respectively on the upper face of the write line 51b, and the TMR elements 10 and 20, 11 and 21, 12 and 22, 12 and 23, and 14 and 24 are disposed in opposite to each other in vertical direction. For example, with respect to a memory cell 201 that is fabricated by TMR elements 11 and 21, a third write line 52 is disposed at an intermediate position between the first and second write lines 51a and 51b so as to be orthogonal to the write lines 51a and 51b. Any arrangement and function other than the above is similar to that shown in the first embodiment, and a detailed description will be omitted here.

Figure 11:
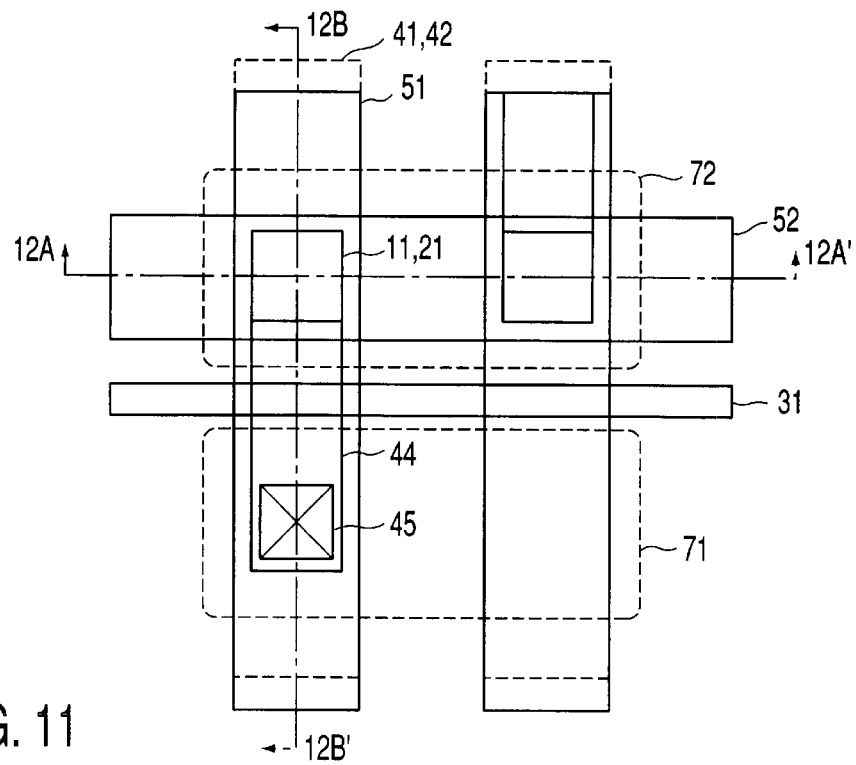
FIG. 11 is a view showing a planar structure of a memory cell in the second embodiment.
Figure 12A:
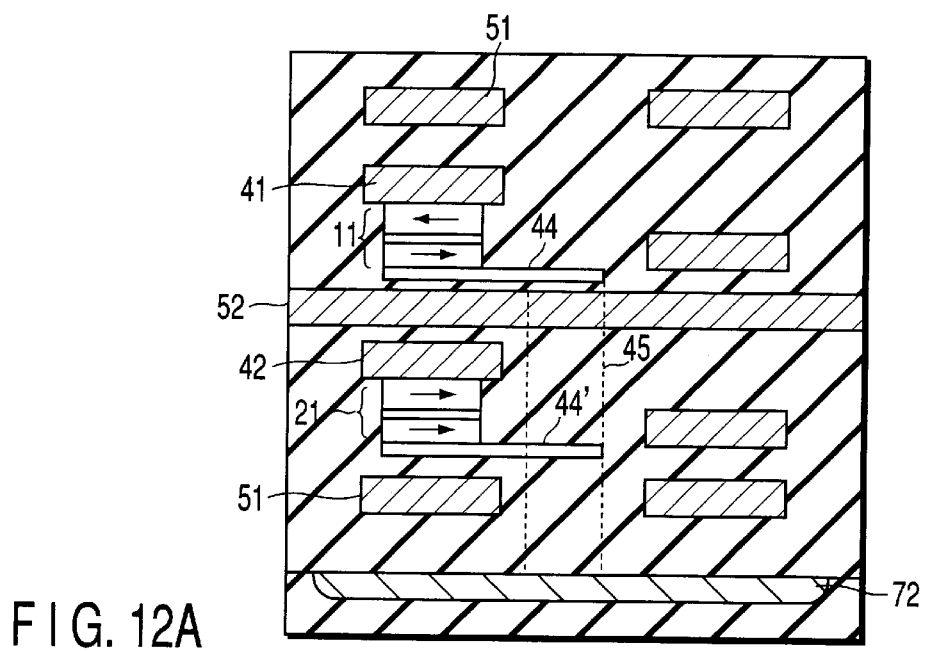
FIGS. 12A and 12B are views showing cross sections taken along the lines 12A—12A and 12B—12B in the memory cell structure shown in FIG. 11.
Figure 12B:
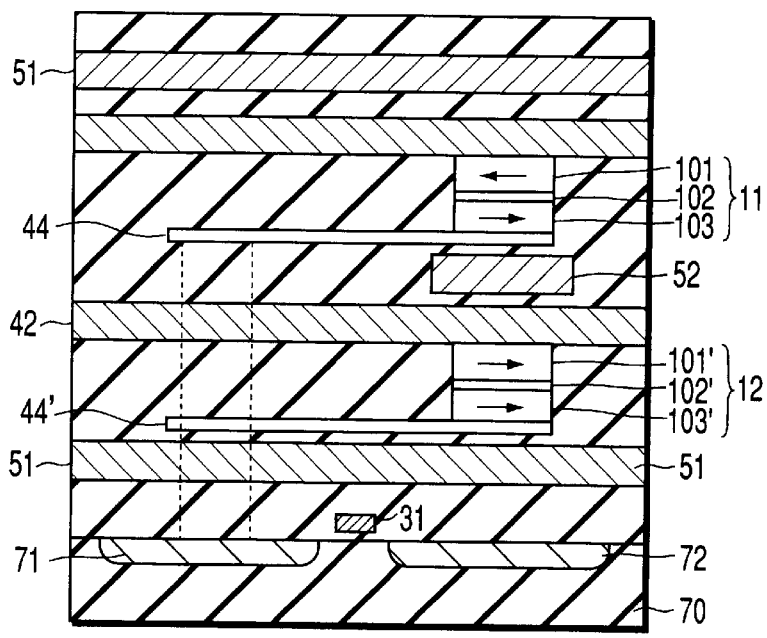

FIG. 11 shows a planar structure of a memory cell 201 that corresponds to that shown in FIG. 10. FIGS. 12A and 12B schematically illustrate cross sections of the memory cell that corresponds to that shown in FIG. 11, taken along the lines 12A—12A and 12B—12B.

In the present embodiment, unlike the first embodiment, common cell plates 44 and 44' are provided at the upper and lower two layers; the cell plate 44 is connected at the lower end of the upper TMR element 11; and the cell plate 44' is connected at the lower end of the lower TMR element 21. Further, a data line 41 is connected to the upper layer of a record layer 101 of the TMR element 11, and a data line 42 is connected to the upper layer of a record layer 101' of the TMR element 21.

As described above, in the present embodiment, unlike the first embodiment, the TMR element 11 and 21 and write line 51, and further, the data lines 41 and 42 are disposed in the same plane in a direction vertical to the layer face. Any arrangement or function other than the above is similar to that shown in the first embodiment, and an advantageous effect similar to that of the first embodiment can be provided. In addition, in the present embodiment, the two TMR elements 11 and 21 are disposed in vertical direction, and an area for one memory cell is about 8 to $12F^2$, which is smaller than that of the first embodiment.

(Third Embodiment)

FIG. 13 is a view schematically illustrating disposition of a TMR element and a write line that configure the magnetic memory array according to a third embodiment of the present invention.

In FIG. 13, reference numerals 10 to 14 and reference numerals 20 to 24 denote TMR elements, and reference numerals 51 and 52 denote write lines. For a better understanding, a structure other than those of the TMR elements and write lines is omitted here. Unlike the second embodiment shown in FIG. 10, a third write line 52 passes underneath a second write line 52b instead of between the first and second write lines 51a and 51b.

Figure 14:
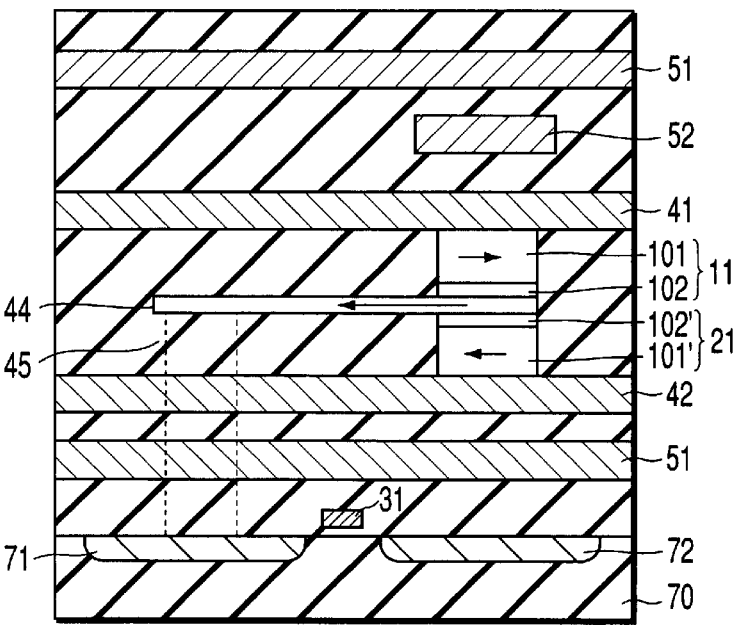
FIG. 14 is a view showing a sectional structure of an element of the magnetic memory array according to the third embodiment.

FIG. 14 is a view schematically illustrating a cross section of the memory cell in the third embodiment. In the present embodiment, unlike the first and second embodiments, the TMR elements 11 and 21 are formed at the upper and lower sides of a common cell plate 44, respectively. Further, a data line 41 is connected to the upper layer of a record layer 101 of the TMR element 11, and a data line 42 is connected to the lower layer of a recording layer 101' of the TMR element 21.

In addition, in the present embodiment, the cell plate is made of a ferromagnetic material. This material is characterized by functioning as a common pinned layer of the TMR elements 11 and 21. That is, the TMR element 11 is fabricated by a record layer 101, a tunnel barrier 102, and a cell plate 44, and the TMR element 21 is fabricated by a record layer 101', a tunnel barrier 102', and a cell plate 44, respectively.

With such arrangement, in the present embodiment, there is provided an advantage that a cell array can be easily manufactured in comparison with the second embodiment, and a dispersion in characteristics of the TMR elements 11 and 21 is reduced. In the cell plate 44, only a portion configuring the TMR elements 11 and 21 may be made of a ferromagnetic material, and the other portion may be made of a non-magnetic material.

According to the present embodiment, the TMR elements and write lines are stacked in the direction of the layer face, thus making it possible to significantly reduce a cell area. When F is defined as a data line interval, the dimensions of one memory cell is 8 to $12F^2$, and about half of the cell area can be achieved in comparison with the first embodiment.

(Fourth Embodiment)

Hereinafter, a fourth embodiment concerning a circuit configuration of a magnetic memory device according to the present invention will be described with reference to a circuit diagram shown in FIG. 15.

The magnetic memory device according to the present invention comprises two or more tunnel junctions for each of a plurality of constituent memory cells. In this fourth embodiment, a description will be given by using a double tunnel junction element 111 that comprises two tunnel junctions, and however, an aspect in which this double tunnel is expanded to a multiple tunnel junction is included in the present invention.

A configuration of double tunnel junction elements 111a and 111b shown in FIG. 15 will be described using an element 111a. The element 111a comprises: a tunnel junction 111a-1 that is formed of a first pinned layer, a first tunnel barrier, and a first magnetic layer; and a tunnel junction 111a-2 that is formed of a second magnetic layer, a second tunnel barrier, and a second pinned layer. When these are stacked sequentially, the resultant stack is composed of the first pinned layer, first tunnel barrier, first magnetic layer, non-magnetic conductive layer, second magnetic layer, second tunnel barrier, and second pinned layer which are stacked in this order.

First and second pinned layers are ferromagnetic layers having their magnetizations pinned, and its magnetization does not change even in a writing magnetic field. In first and second magnetic layers, thanks to the non-magnetic conductive layer inserted between these magnetic layers, always their magnetizations of the first and second magnetic layers are always antiferromagnetically coupled. The first and second magnetic layers and the non-magnetic conductive layer constitute the recording layer. The magnetization configuration of the recording layer can be changed by applying the writing magnetic field.

Differential detection of storage information on these tunnel junction elements 111a and 111b will be described by using the tunnel junction element 111a shown in FIG. 15. Information is stored so that one of the tunnel junctions 111a-1 and 111a-2 is at a low resistance $R_p$, and the other is at a high resistance $R_{AP}$. Here, the low resistance $R_p$ is the resistance in which magnetizations of the magnetic layer and the pinned layer are parallel to each other; and a high resistance $R_{AP}$ is the resistance in which the magnetization of the magnetic layer is anti-parallel to that of the pinned layer.

In this double tunnel junction element 111a, the first pinned layer is connected to a data line 113 and the second pinned layer is connected to a data line 112. These layers are connected to a common sense amplifier 17.

The recording layer is electrically connected to a source or drain of a transistor 114a. This configuration is provided such that all or either of the first magnetic layer, the non-magnetic conductive layer, and second magnetic layer that configure the recording layer are electrically connected to the source or drain via a conductive layer.

Figure 15:
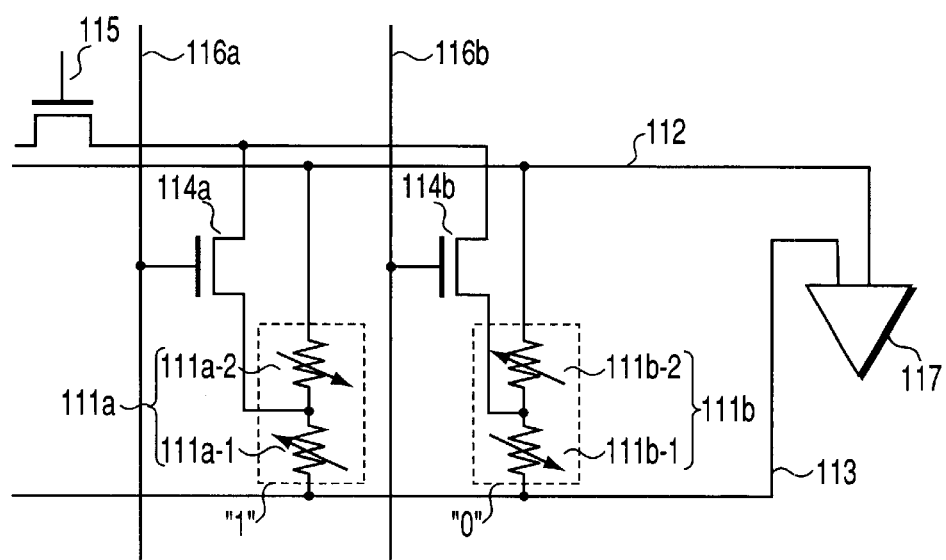
FIG. 15 is a view showing an electrical equivalent circuit of a magnetic memory cell array according to a fourth embodiment.

Another double tunnel junction element having the same configuration as a double tunnel junction 111a, for example, a double tunnel junction element 111b shown in FIG. 15 is connected in parallel to data lines 112 and 113 in the same format as the element 111a. In addition, a connection between the storage layer of the double tunnel junction element 111b and a cell transistor 114a are made in a manner similar to that of the double tunnel junction element 111a.

Two or more tunnel junction elements connected to the same data lines 112 and 113 can be provided in plurality, and are disposed in array shape in a direction in which the data lines 112 and 113 shown in FIG. 15 extend. In addition, cell transistors 114a and 114b of memory cells connected to the same bit lines shown in FIG. 15 are connected in common to the source or drain of a bit line selection transistor 115.

The gate of each cell transistor is connected to each of the corresponding word lines 116a and 116b. Although not shown, the gate electrodes of the cell transistors of memory cells disposed in array shape can be connected in common to the same word lines in a lengthwise direction of word lines.

In the fourth embodiment, one memory cell is composed of one transistor and a double tunnel junction element, whereby a differential system can be achieved, and there is no need to use reference cells. In addition, bit size can be significantly reduced, and a memory device with its large capacity can be achieved. Further, a problem with dispersion of cell transistors can be reduced, and thus, noise can be significantly reduced. As a result, the obtained S/N ratio is 10 times or more as high as a conventional MRAM. Furthermore, the reduction of the magnetoresistance ratio depending on the applied voltage is small because double or more multiple tunnel junction is used. Still further, due to the fact that the recording layer is consist of the first and second ferromagnetic layers which are anti-ferromagnetically coupled with each other, the demagnetization field still remains small even if the size of the memory cell is reduced in sub-micron region. Therefore, a large capacity, non-volatile memory with its small power consumption can be provided.

(Fifth Embodiment)

Figure 16:
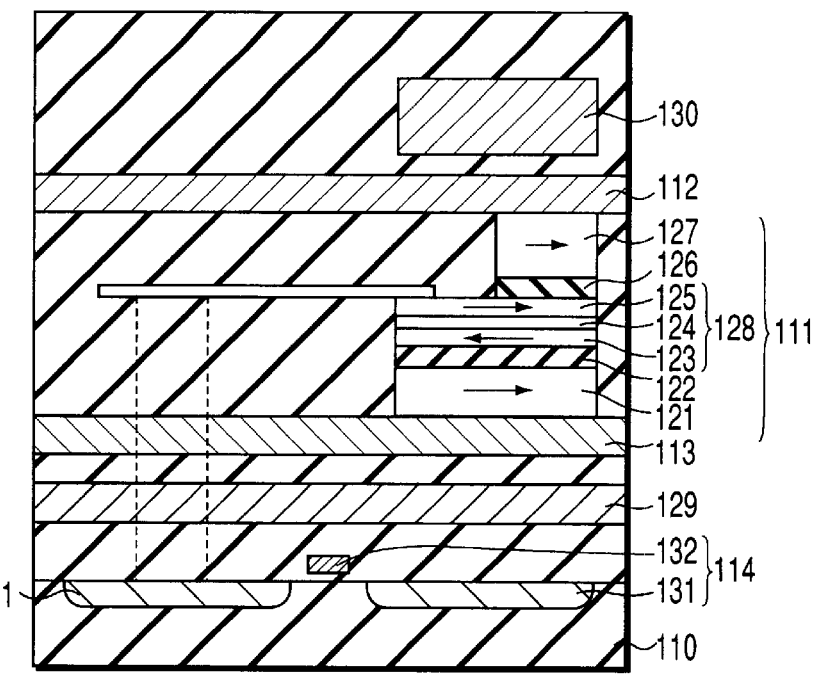
FIG. 16 is a view showing a sectional structure of an element of a magnetic memory cell array according to a fifth embodiment of the present invention.

Fifth embodiment describes a structure of a memory device that configures a circuit described in the fourth embodiment and magnetic information writing/readout with reference to the sectional view shown in FIG. 16. In the FIG. 16, like elements shown in FIG. 15 are designated by line reference numerals, and a detailed description will be omitted here.

According to a double tunnel junction element 111 of the illustrative embodiment, there are formed to be sequentially stacked: a first pinned layer 121; a first tunnel barrier 122; a first magnetic layer 123; a non-magnetic conductive layer 124; a second magnetic layer 125; a second tunnel barrier 126; and a second ferromagnetic magnetization pinned 127. The first magnetic layer 123, non-magnetic conductive layer 124, and second magnetic layer configure a recording layer 128. In this element 111, a first tunnel junction is formed by the first pinned layer 121, the first tunnel barrier 122, and the first magnetic layer 123; and a second tunnel junction is formed by the second magnetic layer 125, the second tunnel barrier 126, and the second pinned layer 127. Although the recording layer 128 is a tri-layered film, this layer can be further a multiple layered film.

First and second magnetic layers 123 and 125 that configure the recording layer 128 are antiferromagnetically coupled with each other. Namely, the magnetization of the first and second magnetization layers 123 and 125 is maintained in a direction opposite to each other, and the magnetization of these layers is maintained in a direction opposite to each other after inverted by an external magnetic field. Such an anti-ferromagnetic coupling can be achieved by inserting a thin, non-magnetic, conductive layer 124 between the first and second magnetic layers 123 and 125.

The material of the non-magnetic conductive layer 124 that promotes interlayer exchange coupling with the first and second ferromagnetic layer can be selected from publicly known materials. However, it is desirable to use Cu, Ru, Cr, Re, Ir, and alloy including one of these elements of 50 atom. % or more. In particular, Ru, Re, and Ir thin film can promote strong antiferromagnetic interlayer coupling, which is preferable.

In addition, in order to promote magnetization switching by low magnetic field, it is desirable that two magnetic layers has different magnetization. Thus, it is preferable to form first and second magnetic layers with their different layer thickness or to use magnetic layers with their different materials.

The orientations of magnetization of the first and second pinned layers 121 and 127 are pinned to be the same as each other as shown in FIG. 16. The orientations of magnetization of the first and second magnetic layers 123 and 125 coupled antiferromagnetically are inverted from a state "1" shown in FIG. 16 to a state "0", whereby the storage information on these memory cells is changed.

In the state "1" shown in FIG. 16, the orientations of magnetization of the first pinned layer 121 and the first magnetic layer 124 are anti-parallel to each other. Thus, the first tunnel junction is high resistance $R_{AP}$. The orientations of magnetization of the second magnetic layer 125 and the second pinned layer 127 are parallel to each other. Thus, the second tunnel junction is at a low resistance $R_p$. In contrast, in the state "0", the orientations of magnetization of the first pinned layer 121 and the first magnetic layer 123 are parallel to each other. Thus, the first tunnel junction is at a low resistance $R_p$. The orientations of magnetization of the second magnetic layer 125 and second pinned layer 127 are anti-parallel to each other. Thus, the resistance of the second tunnel junction can be at a high resistance $R_{AP}$.

Now, a method of writing operation will be described here. Information is stored by supplying a writing current to the write lines 129 and 130 shown in FIG. 16. The write line 129 extends long in the horizontal direction of the paper face shown in FIG. 16, and the write line 130 extends long in the vertical direction of the paper face. The writing current is supplied to both of them, whereby information is stored in the double tunnel junction element 111 only at its cross point. As shown in FIG. 16, the recording layer 128 is connected to a source or drain 131 of a cell selection transistor 114 via a contact column (wire) made of a conductive material, and the other source or drain 131 of the cell selection transistor 114 is connected to a bit line selection transistor 115 shown in FIG. 15. A contact column for connecting one of the storage layer 128 and source or drain 131 is positioned in front of or at the depth of paper face as indicated by dotted line in FIG. 16 and crosses the data line 113 and write-in line 129 via an interlayered insulation layer.

The longitudinally stacked double tunnel junction shown in FIG. 15 can greatly contribute to reduction of bit size. In addition, when a soft magnetic layer is used for two magnetic layers 123 and 125 that are antiferromagnetically coupled with each other, coercive force is reduced. Thus, a small magnetic field is required for writing information. Even if an element size is reduced, the writing current remains small, and low power consumption is maintained.

Furthermore, as in the fourth embodiment, any reference cells are not used, and there is no need to consider dispersion of transistors or tunnel junction elements. Thus, significant cost reduction is achieved.

In order to increase read sensitivity, it is desirable to use materials with having high magnetoresistance ratio for magnetic materials of first and second ferromagnetic pinned layers or first and second magnetic layers. Therefore, the magnetic layers 123 and 125 and the pinned layers 121 and 127 can be made of such as Co, Fe, CoFe, CoNi, CoFeNi, and FeNi alloys and half metals such as NiMnSb or Co$_2$MnGe. In half metals, only one energy gap exists at one spin band. Thus, spin polarization rate is large. By using this metal, higher magnetoresistance effect can be achieved. As a result, more signal output can be obtained.

In addition, it is possible to use a variety of means for pinning magnetization of the pinned layers 121 and 127. For example, there are provided means using a ferromagnetic material with higher coercive field than the magnetic layers 123 and 125 of the recording layer 128; means for pinning magnetization of the pinned layer by utilizing exchange coupling between the anti-ferromagnetic layer and the ferromagnetic layer which are in contact with each other; and means for making the ferromagnetic layer in contact with a hard magnetic layer in place of the anti-ferromagnetic layer to fix magnetization of the pinned layers 121 and 127 using the leakage magnetic field. Anti-ferromagnetic layer materials used for exchange coupling can include materials employed in a general spin valve GMR such as FeMn, IrMn, and PtMn.

In addition, as tunnel barriers 122 and 126, there can be used a variety of insulation non-magnetic materials such as Al$_2$O$_3$, Ta$_2$O$_5$, silicon nitride silicon oxide, or MgO. The thickness of these layers preferably ranges from 5 angstroms to 30 angstroms.

Further, the magnetic element thin layers as described above can be fabricated by using a general apparatus for forming a thin layer such as molecule beam epitaxy (MBE) approach, various sputtering approach, or vapor deposition approach. In addition, the structure as shown in the illustrative embodiment can be fabricated using fine processing technique and multiple layered wiring technique.

(Sixth Embodiment)

Figure 17:
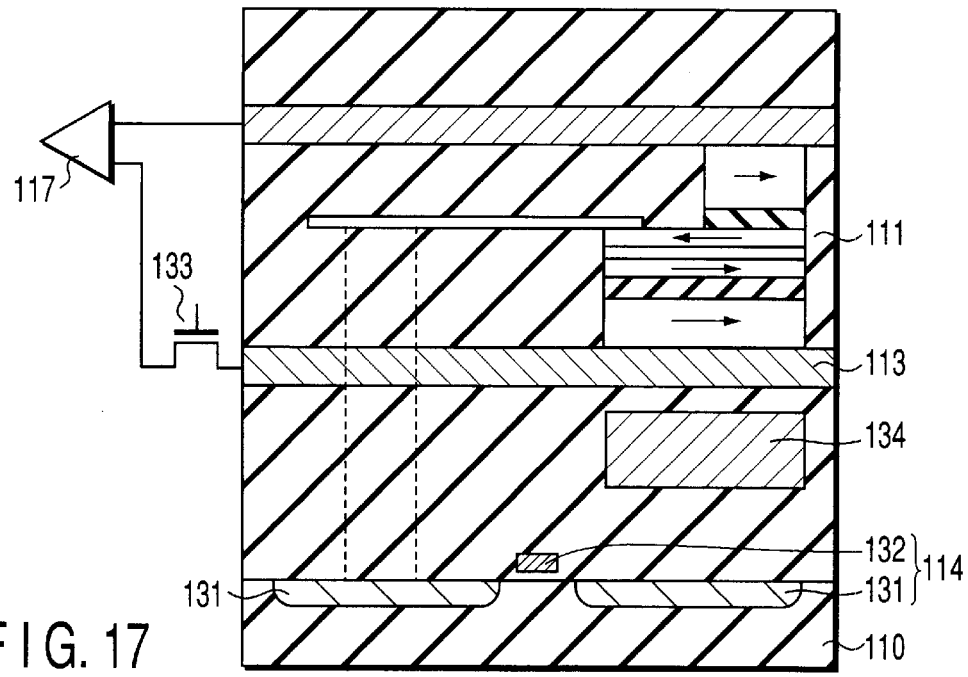
FIG. 17 is a view showing a sectional structure of an element of a magnetic memory cell array according to a sixth embodiment of the present invention.

A sixth embodiment describes another structure of the memory device that configures a circuit described in the fourth and fifth embodiments and writing/readout of the information using a sectional structure of FIG. 17 and a schematic circuit diagram. In FIG. 17, like elements in FIGS. 15 and 16 are designated by like reference numerals, and a detailed description will be omitted here.

In the illustrative embodiment, there is shown a circuit in which one of the data lines 112 and 113 and the data line 113 and sense amplifier 117 shown in FIG. 17 are connected via a transistor 133. In this manner, in FIG. 16, one of two write-in line 129, 130 can be eliminated. That is, during information writing, a current is supplied to the data line 112 and write-in line 134, and at the same time, the transistor 133 is turned OFF. In this manner, the current that flows to the data line 112 does not flow through a tunnel junction, and contributes only to generating a magnetic field for writing.

Thus, one write-in line can be eliminated by inserting the transistor 133, and the number of wired layers can be reduced.

(Seventh Embodiment)

Figure 18A:
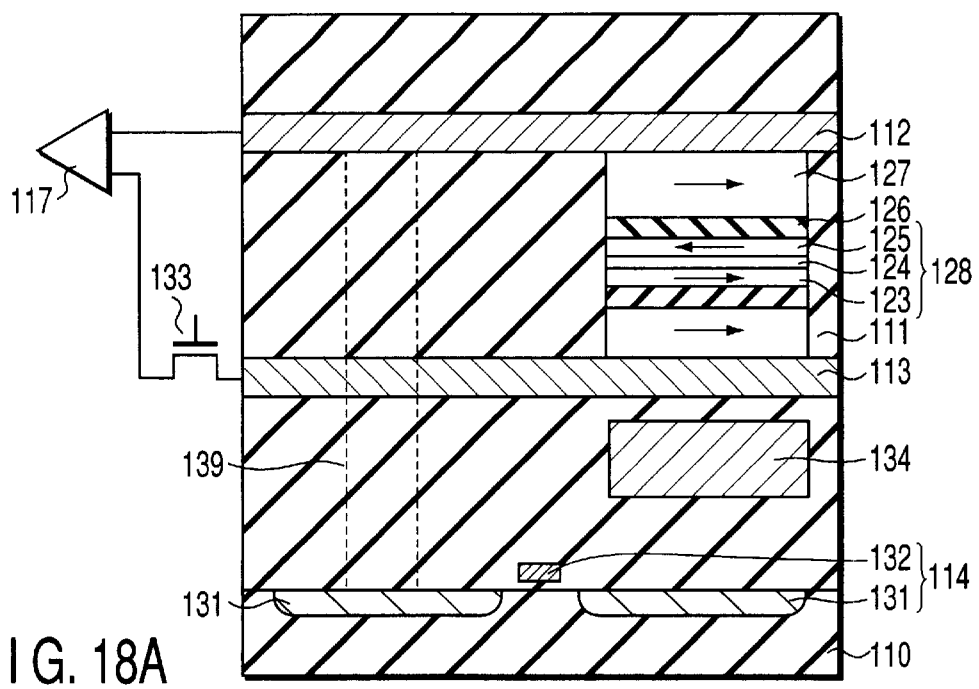
FIGS. 18A and 18B are views each showing a sectional structure of an element of a magnetic memory cell array according to a seventh embodiment of the present invention.
Figure 18B:
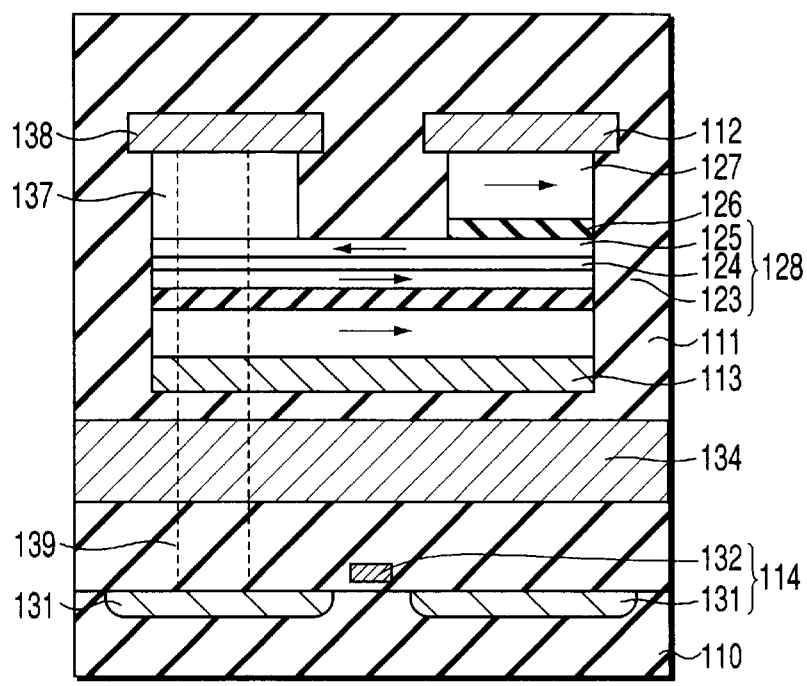

A seventh embodiment described another configuration of the memory device that configures the circuit described in the fourth embodiment and writing/readout of the information by using the sectional structure and schematic circuit diagram shown in FIGS. 18A and 18B. In FIGS. 18A and 18B, Like elements shown in FIGS. 15 to 17 are designated by line reference numerals, and a detailed description will be omitted.

In the seventh embodiment, as shown in FIGS. 18A and 18D, one of source or drain 131 of the cell selection transistor 114 is connected to the recording layer 128 via a cell plate 138 and a contact 139. This is formed by providing a hole at the second tunnel barrier 126 and second pinned layer 127 shown in FIG. 16, and padding the hole with an insulating material. In addition, a non-magnetic conductive layer 137 can be used. In this case, it is required to stack and process a non-magnetic conductive layer.

With such a configuration as shown in FIGS. 18A and 18B, when information is written, a current is supplied to the data line 112 and the write-in line 134. When a switch transistor 133 connected to the data line 113 is turned OFF, no tunnel current flows to the double tunnel junction 111. The information can be written into the recording layer 128 by a composite magnetic field for two currents that flow to the data line 112 and the write-in line 134.

In addition, when stored information is read out, the switch transistor 133 shown in FIGS. 18A and 18B is turned ON so that a current flows to the data lines 112 and 113. If the transistor 114 is turned ON, power can be supplied to the double tunnel junction 111.

(Eight Embodiment)

Figure 19:
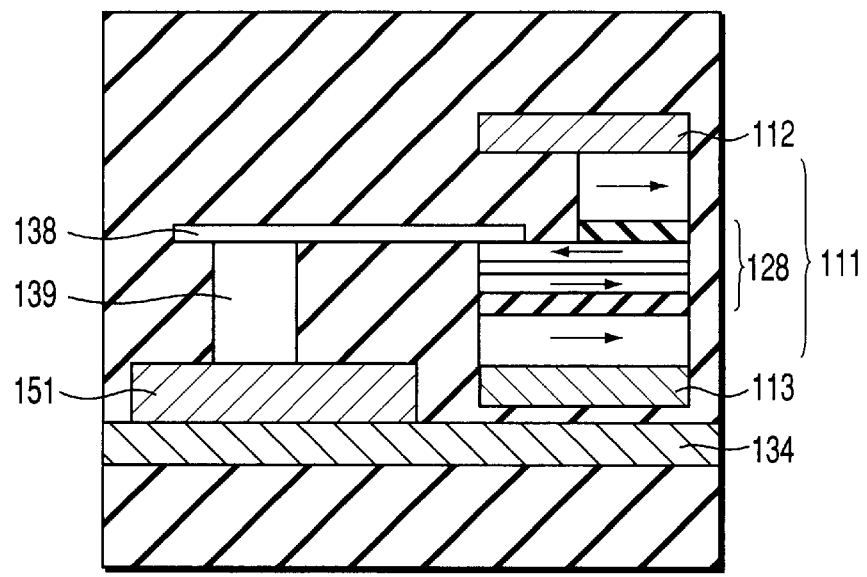
FIG. 19 is a view showing a sectional structure of an element of a magnetic memory cell array according to an eighth embodiment of the present invention.

An eight embodiment describes a structure of the memory device that configures the circuit described in the fifth embodiment and writing/readout of the information with reference to a section structure shown in FIG. 19 and a schematic circuit diagram. In FIG. 19, like elements shown in FIGS. 15 to 18 are designated by like reference numerals, and a detailed description will be omitted.

FIG. 19 shows a sectional view of a magnetic memory cell according to the ninth embodiment. This embodiment is characterized by using a junction type diode 151 as a cell selection semiconductor element. A double tunnel junction element 111 is vertically interposed between first and second data lines 112 and 113 extending in a vertical direction with respect to a sheet of the drawing. A recording layer 128 and the diode 151 are connected to each other by a cell plate 138 and a contact 139. The diode 151 is connected to a write line 134. The rectification direction of the diode 151 can be defined depending on the composition of the writing/read out circuitry, as shown in later. The write-in line 134 is perpendicular to the first and second data lines 112 and 113 and also functions as a bit line. The write-in operation is performed by flowing a signal current through the data lines 112 and 113 and the write-in line 137 perpendicular thereto. In this case, the diode prevents the writing current from flowing to the double tunnel junction element 111. The diode 151 may be formed of an element having a rectifying function such as a pn junction diode, a Schottky junction diode, a MIS junction diode and the like.

In the fifth to seventh and ninth embodiments described above, although a double tunnel junction element in which layers are formed to be stacked in the vertical direction of a substrate face is used for the tunnel junction element in the memory and cell, the tunnel junction elements of the present invention are not limited thereto, and various modifications can occur. Namely, the present invention is applicable to a double or more multiple tunnel element. In addition, there is no need for these layers to be always formed to be stacked.

(Ninth Embodiment)

Figure 20:
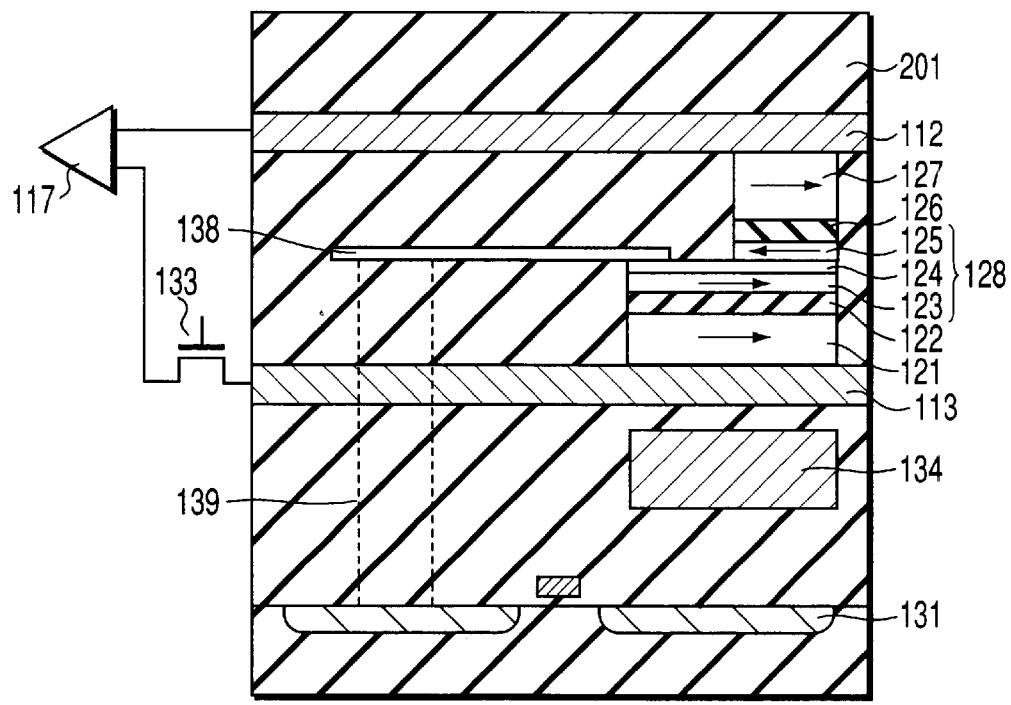
FIG. 20 is a view showing cross sections of the memory cell structure of a magnetic memory cell according to a ninth embodiment.

FIG. 20 shows a sectional view of a magnetic memory cell according to the ninth embodiment.

A memory cell 201 is fabricated by a first pinned layer 121 whose magnetization direction is pinned, a first tunnel barrier 122, and a recording layer 128 formed of a first magnetic layer 123 whose magnetization direction changes depending on a the magnetic field, a non-magnetic conductive layer 124 and a second magnetic layer whose magnetization direction changes depending on the magnetic field, a second tunnel barrier 126, and a second pinned layer 127 whose magnetization direction is pinned, which are stacked in this order. In other words, the first pinned layer 121, the first tunnel barrier 122 and the first magnetic layer form a first tunnel junction. The second magnetic layer 125, the second tunnel barrier 126 and the second pinned layer 127 form a second tunnel junction. The non-magnetic conductive layer 124 and cell selection transistor 131 are connected to each other via a cell palate 138 and a contact 139.

The first and second data lines 112 and 113 sandwich vertically the first and second tunnel junctions and are perpendicular to a write line 134. The write operation is performed by flowing a writing current to the data lines 112 and 113 and the write-in line 137 perpendicular thereto. In this case, a switch transistor 133 is may be provided on the front stage of a sense amplifier 117 in order to prevent a leakage flowing via the data lines 112 and 123.

The non-magnetic conductive layer 124 is formed of a metal selected from Cu, Ru, Cr, Re and Ir or an alloy containing Cu, Ru, Cr, Re and Ir not less than 50 atom %.

In the magnetic memory device of this embodiment, the first magnetic layer 123 connected to the nonmagnetic conductive layer 124 and the second magnetic layer 125 are formed so as to separated to each other by such a distance that the coupling between the magnetic layers goes off. This embodiment differs in function from the embodiments of FIGS. 4 to 9. In other words, this embodiment realizes a differential readout using a state wherein one tunnel junction has a low resistance and the other tunnel junction has a high resistance by controlling independently the switching of magnetization without using the anti-ferromagnetic coupling between the first and second magnetic layers.

In this embodiment, since two tunnel junctions are structured in a stack configuration, the area of the cell can be greatly reduced. If the wiring line interval is F, the cell area is 8 to $12F^2$.

(Tenth Embodiment)

Figure 21:
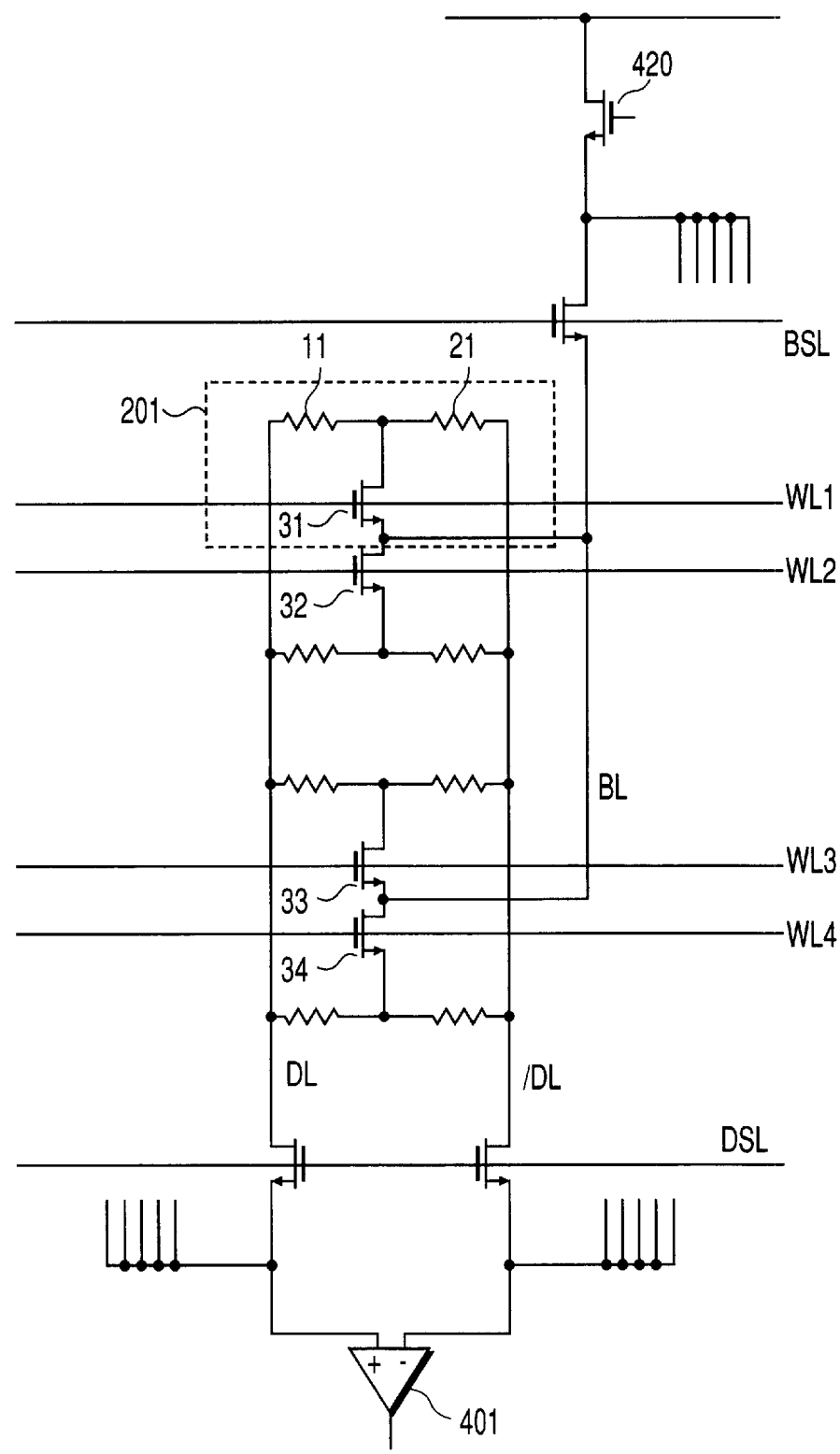
FIG. 21 is a view showing an electrical equivalent circuit of a magnetic memory cell array according to a tenth embodiment.

FIG. 21 is a view showing an electrical equivalent circuit of the magnetic memory cell array according to a tenth embodiment of the present invention. Like elements shown in FIG. 1 are designated by line reference numerals, and a detailed description is omitted here.

In the figure, a region enclosed in the dashed line corresponds to a memory cell 201, Two TMR elements are connected to independent data lines DL and /DL respectively at one end, and are connected to the same bit line BL via a cell selection transistor at the other end. Independent word lines WL1 to WL4 are disposed at selection transistors 31 to 34, respectively, and the selection transistors 31 and 32 and the selection transistors 33 and 34 share a drain region, respectively. The data lines DL and /DL are connected to the current detection type differential amplifier 401 via the selection transistor having a word line DSL, and the bit line BL is connected to the bias voltage clamping circuit 420 via the selection transistor connected to a word line BSL.

In the present embodiment, the present invention is characterized in that the adjacent cells share a drain region of the selection transistor and a bit line. Thus, there is provided an advantage that the number of bit lines can be halved by the adjacent cells sharing the bit line.

(Eleventh Embodiment)

Figure 22:
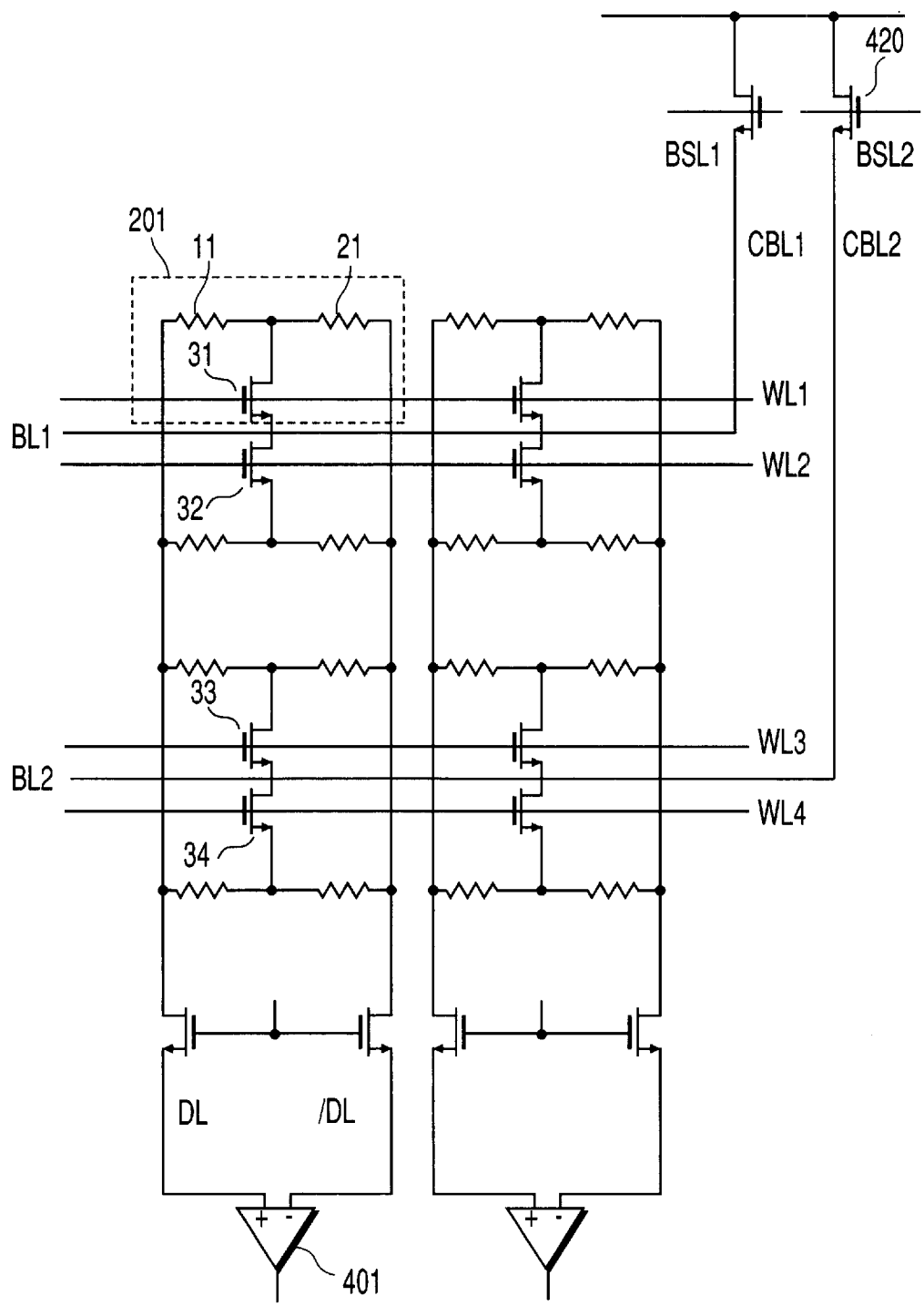
FIG. 22 is a view showing an electrical equivalent circuit of a magnetic memory cell array according to an eleventh embodiment.

FIG. 22 is a view showing an electrical equivalent circuit of the magnetic memory cell array according to an eleventh embodiment of the present invention. Like elements shown in FIG. 1 are designated by line reference numerals, and a detailed description is omitted here.

In the figure, a region enclosed by dashed line corresponds to a memory cell 201. In each cell, the TMR elements are connected to data lines DL and /DL at one end, and are connected to other bit lines BL1 and BL2, respectively, at the other end via a cell selection transistor. Independent word lines WL1 to WL4 are disposed respectively at the selection transistors 31 to 34, and the selection transistors 31 and 32 and the selection transistors 33 and 34 share a drain region, respectively. The data lines DL and /DL are connected to the current detection type differential amplifier 401 via a selection transistor having a common word line DSL.

The bit lines BL1 and BL2 are connected to bit lines CBL1 and CBL2 that run in parallel to the data lines DL and /DL. Further, CBL1 and CBL2 are connected to the bias voltage clamping circuit 420 via a selection transistor having independent word lines BSL1 and BSL2, respectively, at the outside of the memory cell array region.

In the present embodiment, the present invention is characterized in that the bit line BL runs while crossing the data lines DL and /DL, and is shared by the adjacent memory cell arrays. Further, there is provided an advantage that the adjacent memory arrays share BL, and finally, the BL is connected to one CBL that runs in parallel to the data lines DL and /DL, thereby making it possible to reduce the number of lines that run in parallel to be superimposed on the data lines DL and /DL, and reduce an array area more significantly. In the case where the bit line BL and the word line WL run in parallel to each other, the bit line BL and the word line WL are activated simultaneously, thereby making it possible to cause memory cells in the row direction to be read out simultaneously, i.e., making it possible to execute so called, page mode readout.

(Twelfth Embodiment)

FIG. 23 is a view showing an electrical equivalent circuit of the magnetic memory cell array according to a twelfth embodiment of the present invention. Like elements shown in FIG. 1 are designated by line reference numerals, and a detailed description is omitted here.

In the figure, a region enclosed in dashed line corresponds to a memory cell 201. Two TMR elements are connected to independent data lines DL1 and /DL respectively at one end, and are connected to the same bit line BL1 at the other end via a cell selection transistor. In addition, in these memory cells and the memory cells adjacent to each other in the word line direction, these two TMR elements are connected to the data line DL2 and /DL, respectively at one end, and are connected to the same bit line BL2 at the other end via a cell selection transistor. That is, the data line /DL is shared by the adjacent memory cells in the word line direction.

Independent word lines WL1 to WL4 are disposed at the selection transistors 31 to 34, respectively. The data lines DL1 and /DL are connected to the current detection type differential amplifier 401 via a selection transistor having a common word line DSL1. The data line /DL is shared with the adjacent memory cell arrays, but has a different selection transistor. The data lines DL2 and /DL are connected to the current detection type differential amplifier 401 via a selection transistor having a common word line DSL2. Here, the data lines DL1 and DL2 does not share a word line of a selection transistor in order to prevent the leakage through the data line DL2.

In the present embodiment, the present invention is characterized in that the adjacent memory cell arrays share a data line /DL. Thus, there is provided an advantage that the data lines are shared, thereby making it possible to reduce an array area more significantly.

(Thirteenth Embodiment)

FIG. 24 is a view showing an electrical equivalent circuit of the magnetic memory cell array according to a thirteenth embodiment of the present invention. Like elements shown in FIG. 1 are designated by line reference numerals, and a detailed description is omitted here.

In the figure, a region enclosed in dashed line corresponds to a memory cell 201. Two TMR elements are connected to subsidiary data lines sDL and /sDL, respectively, at one end. The other end of each of the TMR elements is connected to the same subsidiary bit lines sBL via a cell selection transistor. Independent word lines WL1 to WL4 are disposed at selection transistors 31 to 34, respectively.

The subsidiary data lines sDL and /sDL and the subsidiary bit line sBL are connected to data lines DL and /DL and a bit line BL, respectively, via a selection transistor having a common word line SASL. The data lines DL and /DL are connected to the current detection type differential amplifier 401 via a selection transistor having a common word line DSL. In addition, the bit line BL is connected to the bias voltage clamping circuit 420 via a selection transistor having a word line BSL at the outside of the memory cell array region.

The present embodiment is characterized in that a memory cell array is divided in the data line direction, thereby forming a subsidiary cell array. Employing such arrangement makes it possible to reduce the number of memory cells in a cell array without extremely increasing the array area. In this manner, there can be avoid a problem with the lowering of an output signal due to an increased number of memory cells.

(Fourteenth Embodiment)

Figure 25:
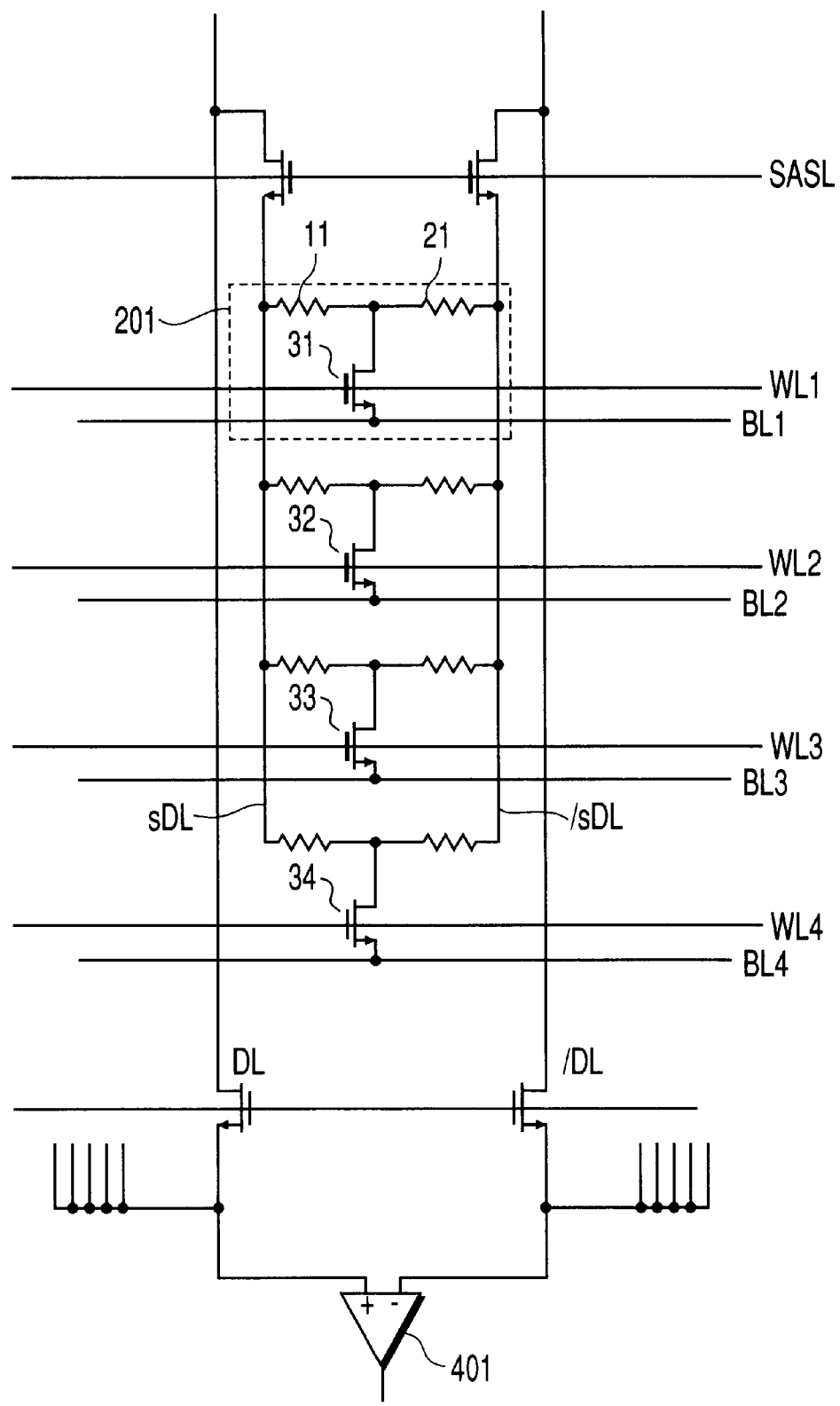
FIG. 25 is a view showing an electrical equivalent circuit of a magnetic memory cell array according to a fourteenth embodiment.

FIG. 25 is a view showing an electrical equivalent circuit of the magnetic memory cell array according to a fourteenth embodiment of the present invention. Like elements shown in FIG. 1 are designated by line reference numerals, and a detailed description is omitted here.

In the figure, a region enclosed in dashed line corresponds to a memory cell 201, and two TMR elements are connected to subsidiary data lines sDL and /sDL, respectively at one end. The other end of each the TMR elements is connected to the bit line BL via a cell selection transistor, and is connected to each of the independent bit lines BL1 to BL4 in each of the memory cell arranged in the data line direction.

Independent word lines WL1 to WL4 are disposed at the selection transistors 31 to 34, respectively. The subsidiary data lines sDL and /sDL are connected to data lines DL and /DL, respectively, via a selection transistor having a common word line SASL. The data lines DL and /DL are connected to the current detection type differential amplifier 401 via a selection transistor having a common word line DSL.

In the present embodiment, the present invention is characterized in that a bit line BL runs while crossing the data lines DL and /DL, and the bit line BL is compatible with a write line.

(Fifteenth Embodiment)

Figure 26:
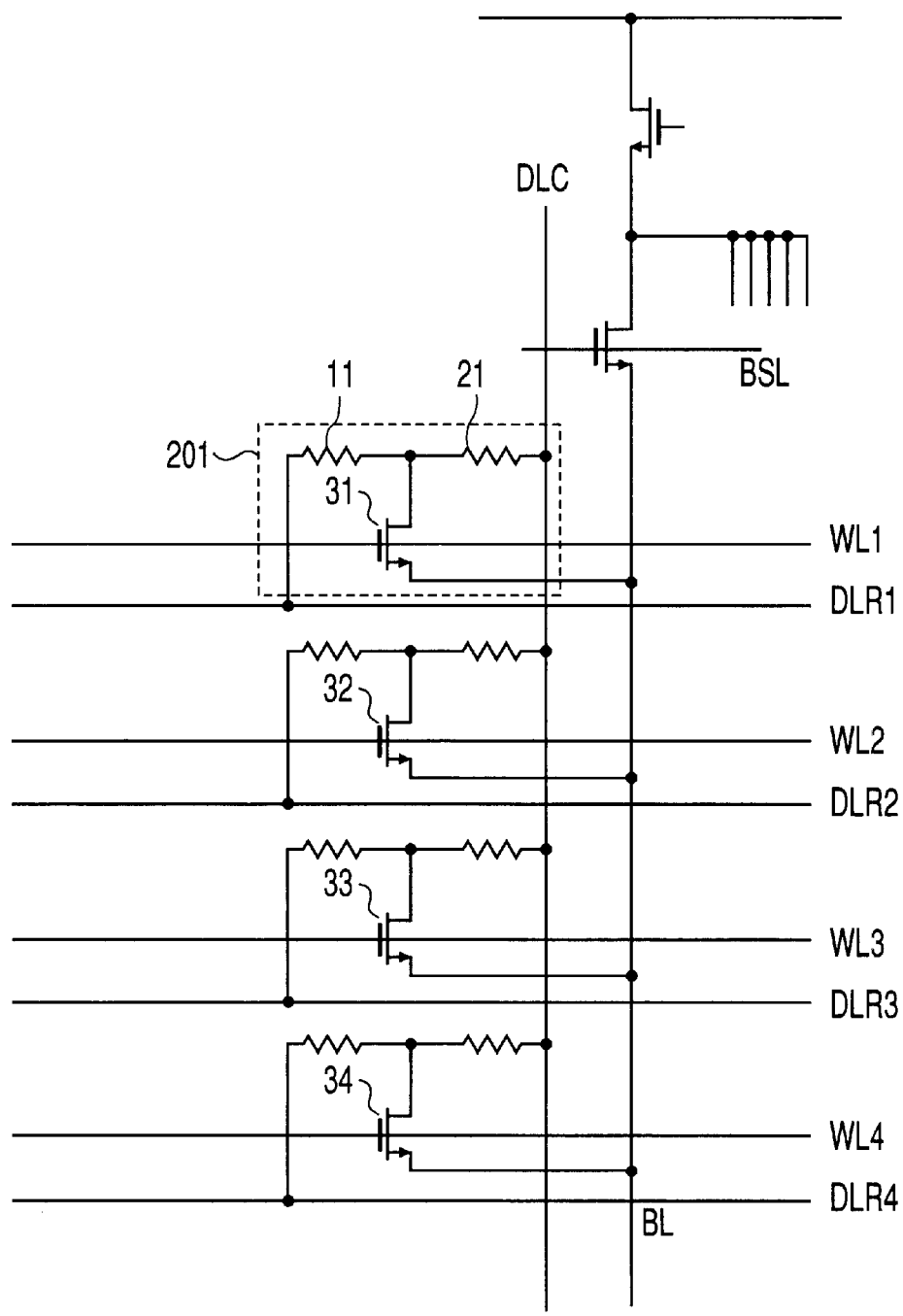
FIG. 26 is a view showing an electrical equivalent circuit of a magnetic memory cell array according to a fifteenth embodiment.

FIG. 26 is a view showing an electrical equivalent circuit of the magnetic memory cell array according to a fifteenth embodiment of the present invention. Like elements shown in FIG. 1 are designated by line reference numerals, and a detailed description is omitted here.

In the figure, a region enclosed by dashed line corresponds to a memory cell 201. In each memory cell, one end of one TMR element is connected to each of the data lines DLR1 to DLR4, and one end of the other TMR element is connected to the same data line DLC. Further, the other end of each of the TMR elements is connected to the same bit line BL via a cell selection transistor. Independent word lines WL1 to WL4 are disposed to the cell selection transistor 31 to 34, respectively. The bit line BL is connected to the bias voltage clamping circuit 420 via a selection transistor having a word line BSL at the outside of the memory cell array region.

In the present embodiment, the present invention is characterized in that data line pairs DLR and DLC run while crossing each other, and the BL runs while crossing the WL similarly. In addition, a bit line is not shared in the word line direction. Thus, cell selection during readout can be uniquely performed by controlling potentials of the BL and WL, and a bias voltage is applied to only a selection cell. Further, the data line pairs DLR and DLC cross each other, and thus, are not short-circuited by an unselected cell. Therefore, operation with stability and high power consumption efficiency can be expected.

(Sixteenth Embodiment)

Figure 27:
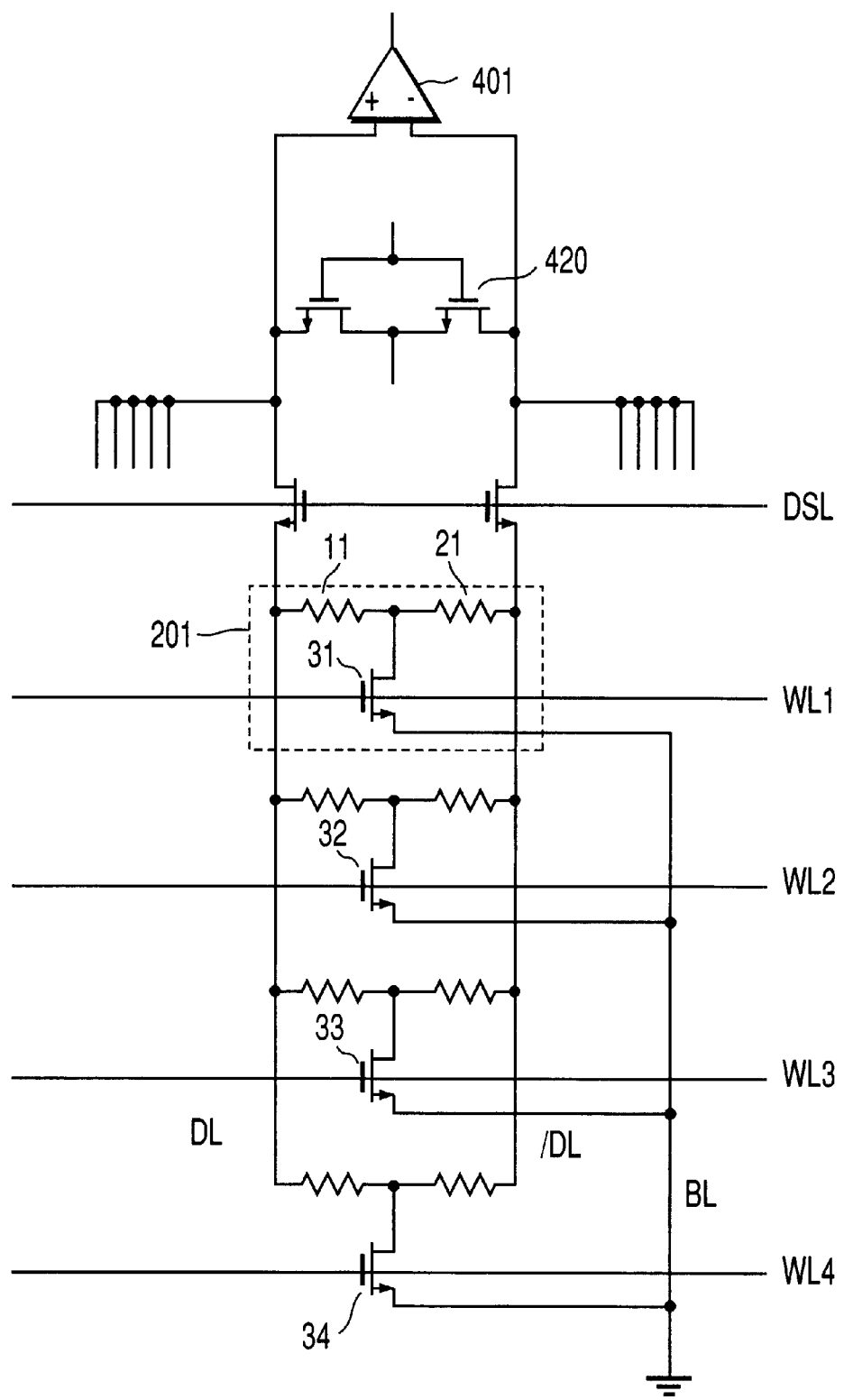
FIG. 27 is a view showing an electrical equivalent circuit of a magnetic memory cell array according to a sixteenth embodiment.

FIG. 27 is a view showing an electrical equivalent circuit of the magnetic memory cell array according to a sixteenth embodiment of the present invention. Like elements shown in FIG. 1 are designated by line reference numerals, and a detailed description is omitted here.

In the figure, a region enclosed by dashed line corresponds to a memory cell 201. Two TMR elements are connected to data lines DL and /DL, respectively, at one end, and are connected to the same bit line BL at the other end via a cell selection transistor. Independent word lines WL1 to WL4 are disposed at the selection transistors 31 to 34, respectively. The data lines DL and /DL are connected to the bias voltage clamping circuit 420 and the current detection type differential amplifier 401 via a selection transistor having a common word line DSL. In addition, a bit line BL is grounded.

In the present embodiment, the present invention is characterized in that the bit line BL is low in potential relevant to the data lines DL and /DL, and a current flows the bit line BL from the data lines DL and /DL via the selection transistor. In FIG. 29, although a bit line potential is defined as a grounded potential, the potential may be set to an arbitrary voltage in a range in which the bit line potential does not exceed a data line potential. In addition, in the present embodiment, the potentials of the data lines DL and /DL are required to be completely equal to each other. This can be easily achieved by a bias voltage clamping circuit or similar technique as illustrated.

(Sixteenth Embodiment)

Figure 28:
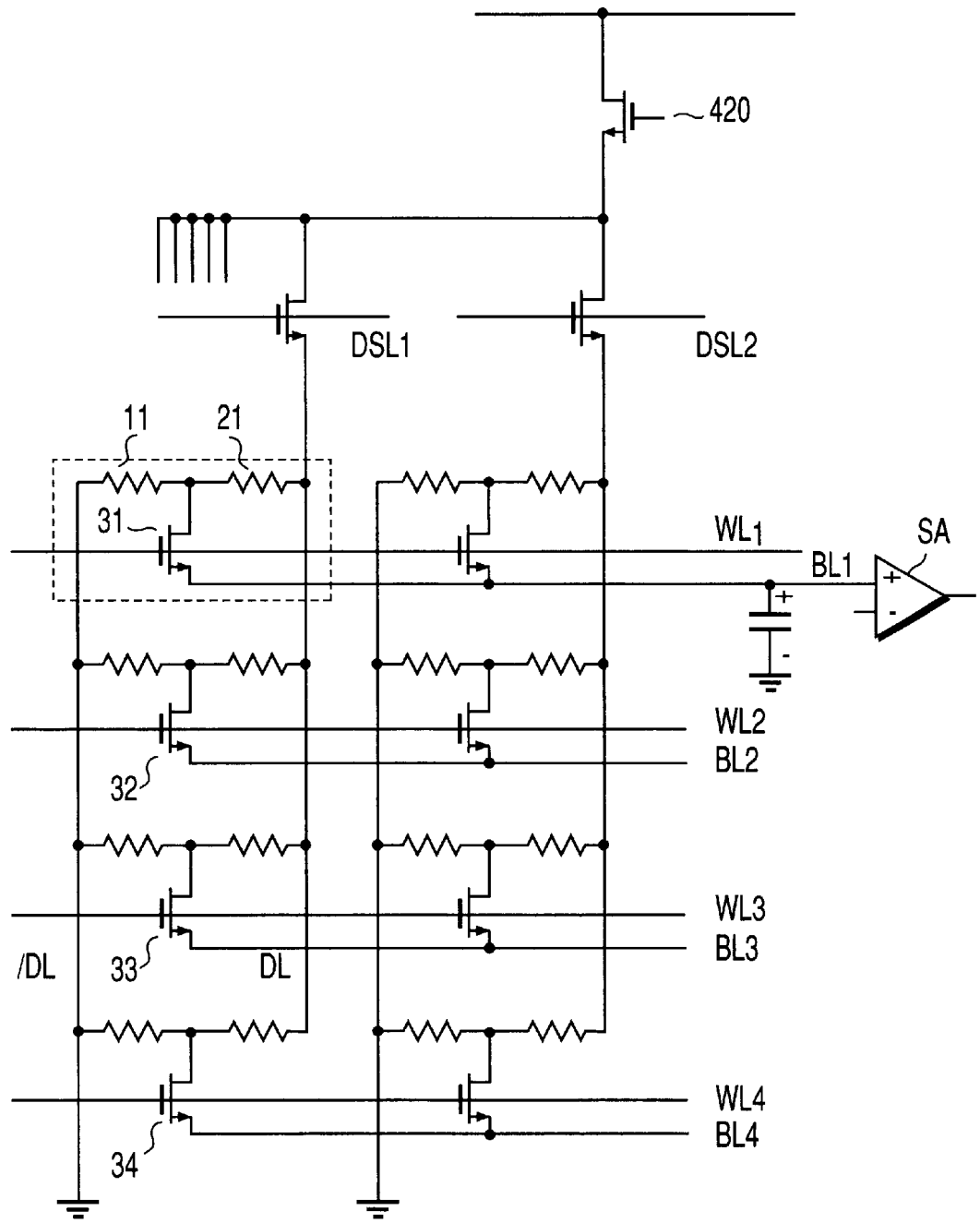
FIG. 28 is a view showing an electrical equivalent circuit of a magnetic memory cell array according to a seventeenth embodiment.

FIG. 28 is a view showing an electrical equivalent circuit of the magnetic memory cell array according to a sixteenth embodiment of the present invention. Like elements shown in FIG. 1 are designated by line reference numerals, and a detailed description is omitted here.

In the figure, a region enclosed by dashed line corresponds to a memory cell 201, and two TMR elements are connected to independent data lines DL and /DL, respectively, at one end. The other end of each of the TMR elements is connected to a bit line via a cell selection transistor, and is connected to each of the independent bit lines BL1 to BL4 arranged in the data line direction. Independent word lines WL1 to WL4 are disposed at the selection transistors 31 to 34, respectively. The data line DL is connected to the bias voltage clamping circuit 420 via a selection transistor having a word line DSL, and the data line /DL is grounded. The bit lines BL1 to BL4 are connected to their different differential sense amplifiers SA, respectively.

Next, an operation of this circuit will be described by exemplifying the memory cell 201. Now, consider a case in which the magnetization configurations of the recording layer and pinned layer of the TMR element 11 are parallel to each other, and those of the TMR element 21 is anti-parallel to each other (record information "1"). In an initial state, the potentials of the WL1 and DSL1 are 0. Then, the potential of the DSL1 is defined as VDD, WL1 is defined as VDD while $V_{bias}$ is applied to the DL, thereby making the selection transistor 31 electrically conductive. When the resistance value of the TMR element 11 is defined as R (1−MR/2), and the resistance value of the TMR element 12 is defined as R (1+MR/2), the value of a voltage to be induced to the BL is obtained as follows.

$$V_1 = V_{bias}/2 \times (1+MR/2) \tag{16}$$

On the other hand, in the case of record information "0", i.e., in the case where the magnetization configuration of the TMR element 11 enters an anti-parallel state, and that of the TMR element 21 enters a parallel state, the value of a voltage induced to the BL is obtained as follows.

$$V = V_{bias}/2 \times (1 \times MR/2) \tag{17}$$

Therefore, for example, when a reference voltage of a differential sense amplifier is set to $V_{REF}=V_{bias}/2$, by comparing the signal voltage of the BL with the reference voltage, the stored information can be discriminated.

In this reading method, a ratio of the divided voltages due to the two TMR elements is detected, and thus, the following advantages are provided.

(1) There is no dependence on a value of a current that flows a TMR element. That is, even if the number of memory cells in a memory cell array is changed, and an impedance between the data lines DL and /DL changes, an output is not affected.

(2) A bias voltage can be divided by two TMR elements, and the reduction of the magnetoresistance ratio depending on the applied voltage can be mitigated.

(3) Almost no current flows a bit line, and the dispersion in characteristics of selection semiconductor elements, in particular, the dispersion in a source/drain resistance can be ignored.

(Eighteenth Embodiment)

FIG. 29 is a view showing an electrical equivalence circuit of a magnetic memory cell array according to an eighteenth embodiment of the present invention. Like elements shown in FIG. 1 are designated by like reference numerals, and a detailed description is omitted here.

In the figure, a region enclosed in dotted line corresponds to a memory cell 201. Two TMR elements each are connected to a respective one of data lines DL and /DL at one end, and are connected to the same bit line BL at the other end via a cell selection transistor 31. Independent word lines WL1 to WL4 are disposed at selection transistors 31 to 34. The data line DL is connected to a bias voltage clamping circuit 420 via the selection transistors each having a word line DSL, and the data line /DL is grounded. The bit line BL is connected to a differential sense amplifier SA via the selection transistor connected to the word line BSL.

In the present embodiment, the bit line BL is shared by a plurality of memory cells, thus making it possible to reduce an array area more significantly.

(Nineteenth Embodiment)

FIG. 30 is a view showing an electronic equivalence circuit of a magnetic memory cell array according to a nineteenth embodiment of the present invention. Like elements shown in FIG. 1 are designated by like reference numerals, and a detailed description is omitted here.

The present embodiment is basically the same as the seventeenth and eighteenth embodiments in memory cell array structure. However, the bit line BL is divided into a subsidiary bit line sBL via a current converting circuit, and a fluctuation of the SBL voltage generated by readout operation is transferred as a current difference to a main amplifier SA at the subsequent stage through the bit line BL by means of the current converting circuit. In the present embodiment, the floating capacity and wiring resistance can be reduced by shorting a length of the bit BL, and fast operation can be achieved by reducing a bit line delay.

(Twenty Embodiment)

Figure 31:
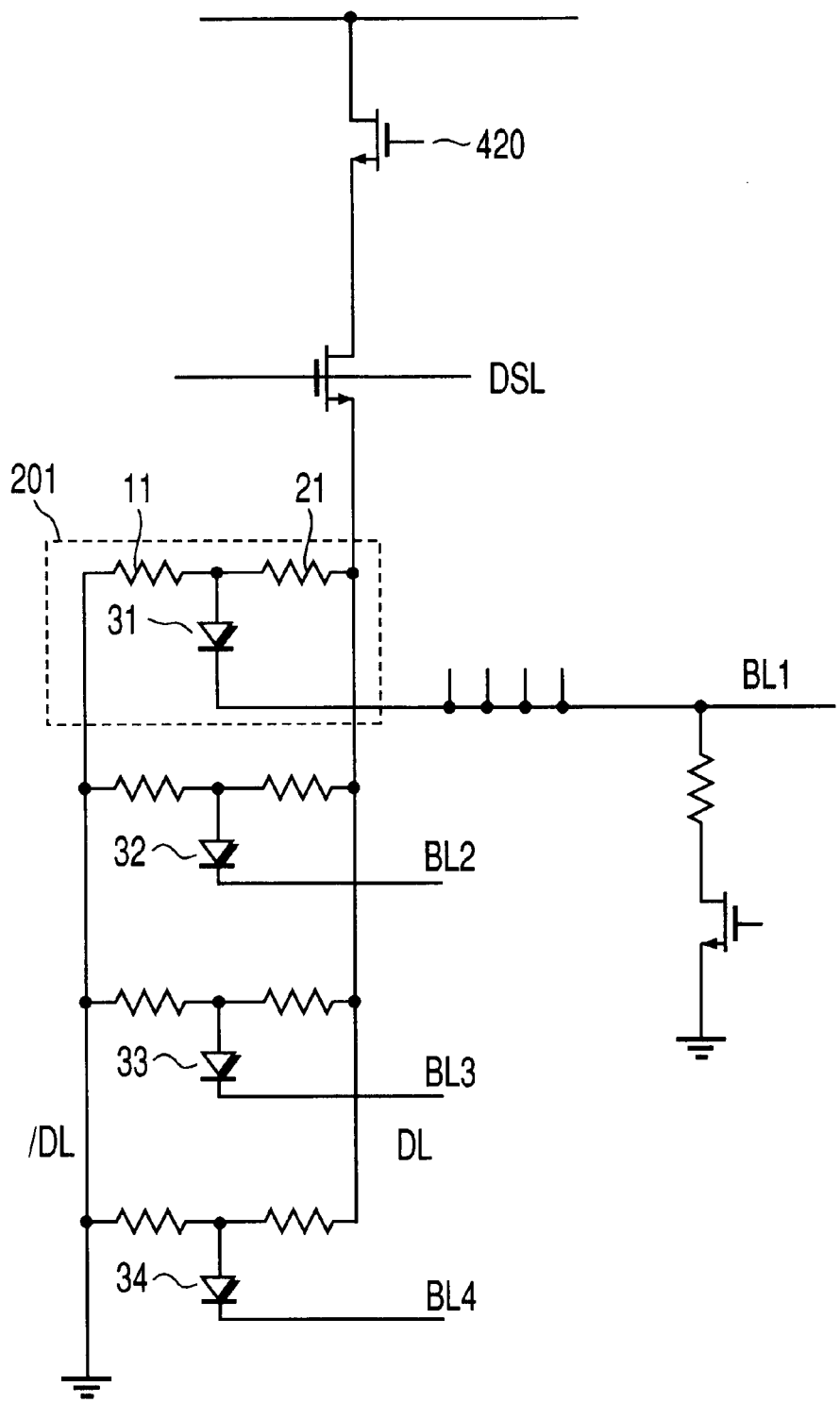
FIG. 31 is a view showing an electrical equivalent circuit of a magnetic memory cell array according to a twenty embodiment.

FIG. 31 is a view showing an electrical equivalence circuit of a magnetic memory cell array according to a twenty embodiment of the present invention. Like elements shown in FIG. 1 are designated by like reference numerals, and a detailed description is omitted here.

In the figure, a region enclosed in dashed line corresponds to a memory cell 201, and two TMR elements are connected to a respective one of the data lines DL and /DL at one end. The other end of each of the TMR elements is connected to the bit line BL via the cell selection diode element 31, and is connected to a respective independent one of bit lines BL1 to BL4 via a memory cell arrayed in the data line direction. The data line DL is connected to a bias voltage clamping circuit 420 via the selection transistors each having the word line DSL, and the data line /DL is grounded. The bit line BL is grounded via the selection transistors connected to a load resistance and a word line BSL.

In the present embodiment, the threshold voltage in forward direction of the diode is utilized for cell selection. That is, a value of the threshold voltage in forward direction of the diode is defined as $V_{TO}$, and it is assumed that $V_{TO} < V_0$ is met. Here, when a potential difference V is applied to specific data lines DL and /DL, a voltage of $V_0 - V_{TO}$ or $V_1 - V_{TO}$ is applied to the sense amplifier connected to the bit line group that crosses the data lines DL and /DL. Therefore, stored information can be read out by discriminating its magnitude.

Figure 32:
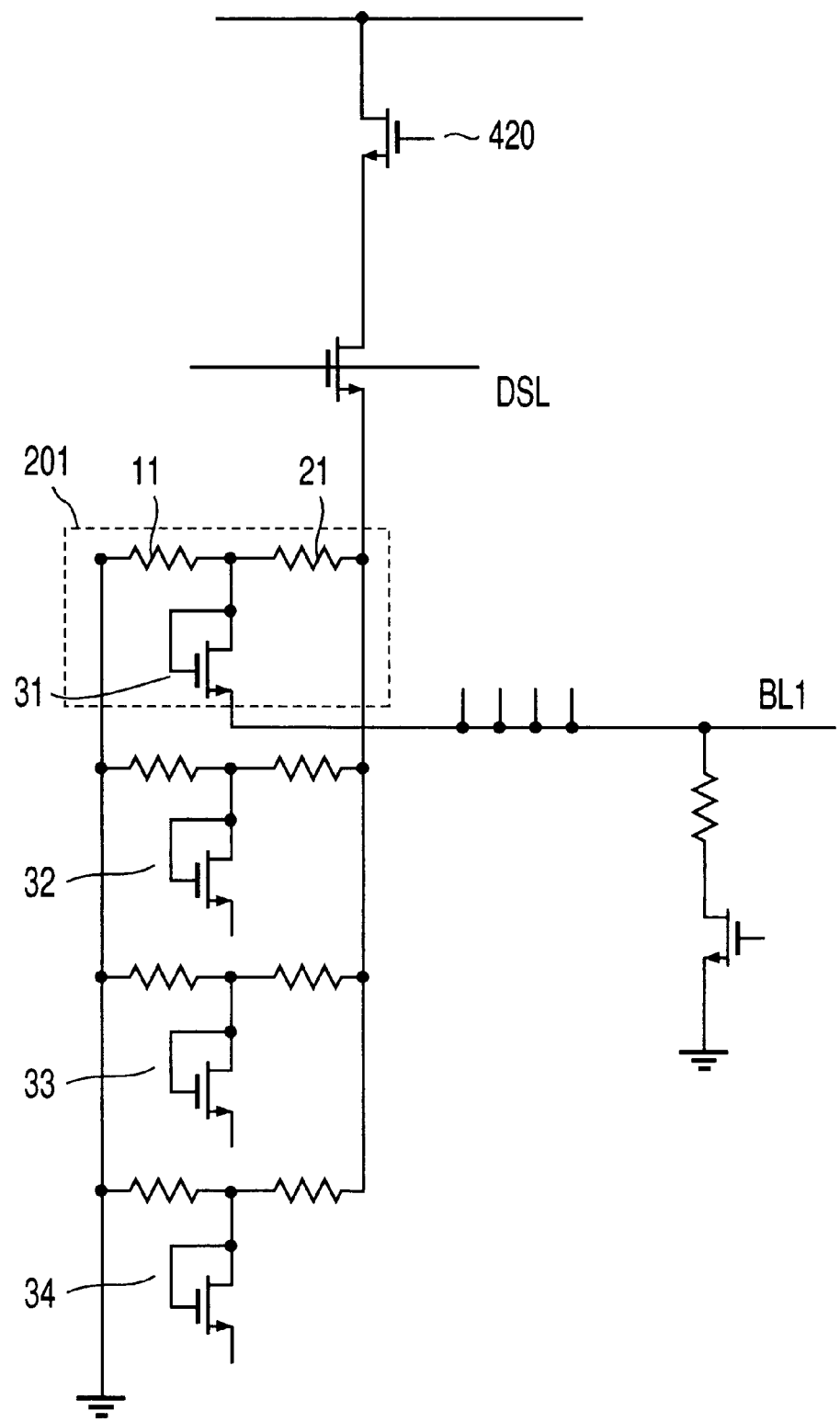
FIG. 32 is a view depicting an equivalent circuit when a pn diode of the magnetic memory cell array according to a modification of the twenty embodiment is replaced with a MOS transistor.

As diode elements for cell selection in the present embodiment, there can be employed a junction type pn-diode, Schottky diode, or MIS diode; and an n-type MOS transistor having a drain/gate terminal short-circuited as shown in FIG. 32. In general, in a magnetic memory device, a MOS transistor is frequently used. A redundant element separation region is required for forming the pn-diode at a semiconductor portion, which leads to an increased cell area. A diode using an nMOS transistor does not cause such a problem, which is a preferred embodiment.

(Twenty-First Embodiment)

FIG. 33 is a view showing an electrical equivalence circuit of a magnetic memory cell array according to a twenty-first embodiment of the present invention. Like elements shown in FIG. 1 are designated by like reference numerals, and a detailed description is omitted here.

In the figure, a region enclosed in dashed line corresponds to a memory cell 201, and two TMR elements are connected to a respective one of the data lines DL and /DL at one end. The other end of each of the TMR elements is connected to a bit line BL via a cell selection diode element 31, and is connected to a respective independent one of the bit lines BL1 to BL4 via memory cells arrayed in the data line direction. The data line DL is connected to a bias voltage clamping circuit 420 via the selection transistors each having the word line DSL, and the data line /DL is grounded. The bit line BL is connected to an offset voltage circuit 430 and a current sense amplifier 402.

Figure 34:
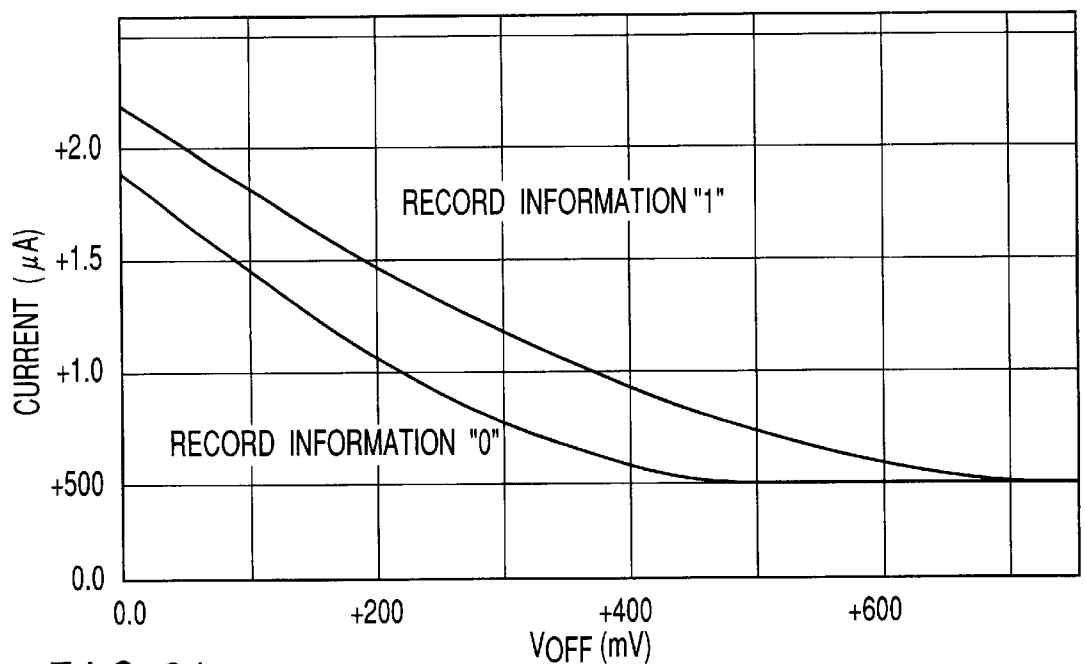
FIG. 34 is a view showing the result obtained when a current that flows a bit line is measured as a function of an offset voltage $V_{off}$ in the twenty-first embodiment.

In FIG. 34, in the present embodiment, a current that flows to a bit line is measured as a function of an offset voltage $V_{off}$. Two curves designate currents $I_0$ and $I_1$ that correspond stored information "1" and "0", respectively. A region in which only $I_0$ is substantially equal to 0 exists in the vicinity of $V_{off}$=500 mV. In this region, a value of $I_1/I_2$ is very large, which is very advantageous in the practical point of view.

A change of $I_0$ and $I_1$ according to such stored information can be achieved by combining a voltage change according to the stored information with a strong non-linearity in the vicinity of the threshold voltage $V_{TO}$ of the diode. In general, the magnitude of $V_{TO}$ in the diode is determined depending on the manufacturing method. Therefore, as in the present embodiment, a method of applying an offset voltage is a preferred embodiment.

(Twenty-Second Embodiment)

Figure 35:
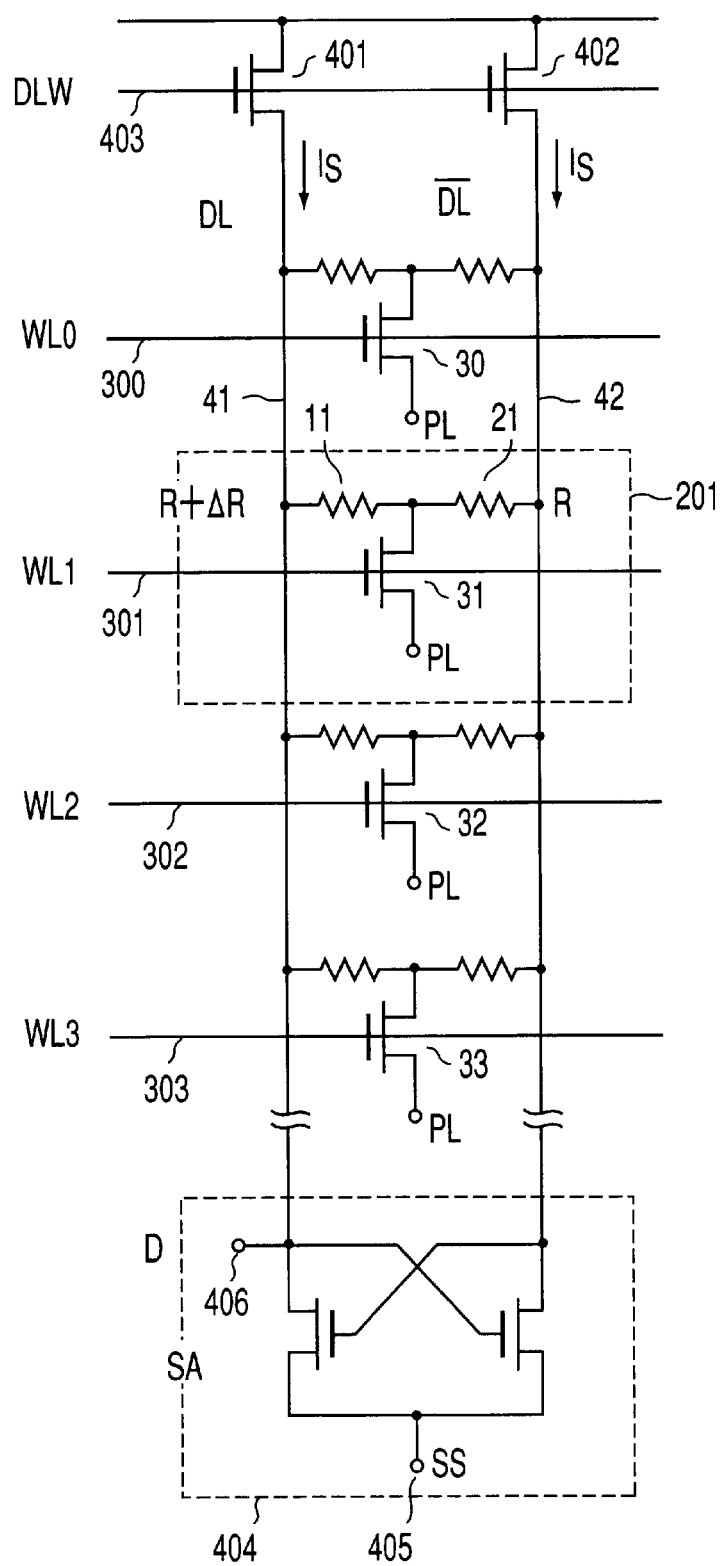
FIG. 35 is a view showing an electrical equivalent circuit of a magnetic memory cell array according to a twenty-second embodiment.

FIG. 35 is a view showing an electrical equivalence circuit of a magnetic memory cell array according to a twenty-second embodiment of the present invention.

In the figure, a region enclosed in dash line corresponds to one memory cell 201. In this memory cell 201, the TMR elements 11 and 21 each are connected to a respective independent one of the data lines 41 and 42 at one end, and the other end of each of the TMR elements 11 and 21 are connected in common to a cell selection transistor 32.

In addition, in each memory cell, independent word lines 301 to 304 are disposed respectively at the cell selection transistors 31 to 34. One end of each of the data lines 41 and 42 is connected to a respective one of constant current sources 401 and 402, and the other end is connected to a sense amplifier 404. A common word line 403 is disposed at a MOS transistor that configures the constant voltage sources 401 and 402. The sense amplifier 404 is a voltage latch type flip flop amplifier, and has a common source terminal 405 and a data terminal 406.

Next, a method of reading out information in the magnetic memory cell array according to the present invention will be described in detail.

Figure 36:
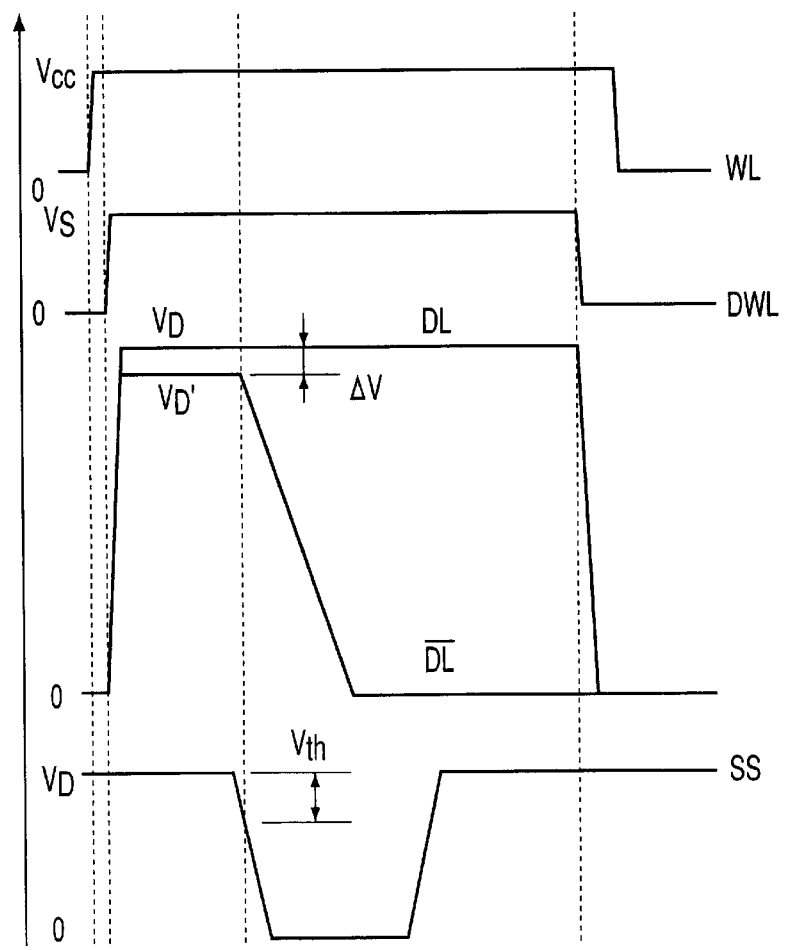
FIG. 36 is a timing chart for illustrating readout operation in the magnetic memory array in the twenty-second embodiment.

FIG. 36 shows a change when there are read potential WL of the word line 302 of the cell selection transistor 32; a potential DLW of the word line 403 connected to the constant current sources 401 and 402; potentials of the data lines 41 and 42 (DL and /DL); and a potential SS of the common source terminal 405 of the sense amplifier 404 by taking a time axis as a horizontal axis.

Now, consider a case in which magnetization of the recording layer of the TMR element 11 is anti-parallel to that of the pinned layer (record information "1"). In an initial state, the potentials of the word line WL of the cell selection transistor 32 and word line DLW that controls the constant current sources 401 and 402 are defined as 0, and a potential of the common source terminal of the sense amplifier 404 is defined as VD. In this state, the data lines 41 and 42 are at floating potentials, and the sense amplifier 404 is separated from the data lines 41 and 42.

Next, a high potential $V_S$ is applied to DLW after WL has been defined as a high potential $V_{cc}$, and the cell selection transistor 32 has been conductive. In this manner, a sense current Is equal to the TMR elements 11 and 21 flows via the data lines 41 and 42. When a voltage fall in cell selection transistor 32 is defined as Vr, the potentials of the data lines 41 and 42 are as follows.

$$DL = VD = (R + \Delta R) \times I_s + Vr / DL = VD' = R \times I_s + Vr \quad (18)$$

That is, $$\Delta V = \Delta R \times I_s \quad (19)$$

is obtained as a differential voltage of the data lines 41 and 42.

Next, in this state, a readout pulse that changes from VD to 0 is applied to the common source terminal 405 of the sense amplifier 404 as illustrated. If a potential difference between DL and SS exceeds a threshold potential Vth of a transistor, the transistor connected to the data line 42 with a low potential starts discharging. As a result, the data line 41 maintains an initial potential Vd, and the other data line 42 is latched by 0V.

In the case of record information "0", the magnetization of the record layer of the TMR element 11 is parallel to that of the pinned layer, and the data line 11 is at a low potential while a sense current is supplied. Thus, when a readout pulse is applied, the data line 41 is latched by 0V. Therefore, a pulse is applied to the common source terminal 405, after a certain period has passed, a voltage D of the data line 41 is acquired by using the terminal 406 of the sense amplifier, whereby readout is performed. After data readout, the potential of each terminal is restored to an initial state as illustrated, whereby the latch of the sense amplifier 404 is reset, and readout operation completes.

In the configuration of the present embodiment, the magnitude φ of the readout pulse applied to the common source terminal 405 of the sense amplifier 404 must be $$VD' \leq \phi \leq VD$$

That is, a margin relevant to the pulse magnitude corresponds to about a differential voltage between the data lines during readout. In order to stabilize an operation of this portion, there may be provided (1) a voltage amplifying circuit at the front stage of the sense amplifier; and (2) a circuit for compensation for dispersion between VD and VD' or the like. Although a flip-flop amplifier is employed in the present embodiment, another amplifying circuit, for example, a current mirror amplifier may be employed for the sense amplifier.

Figure 37:
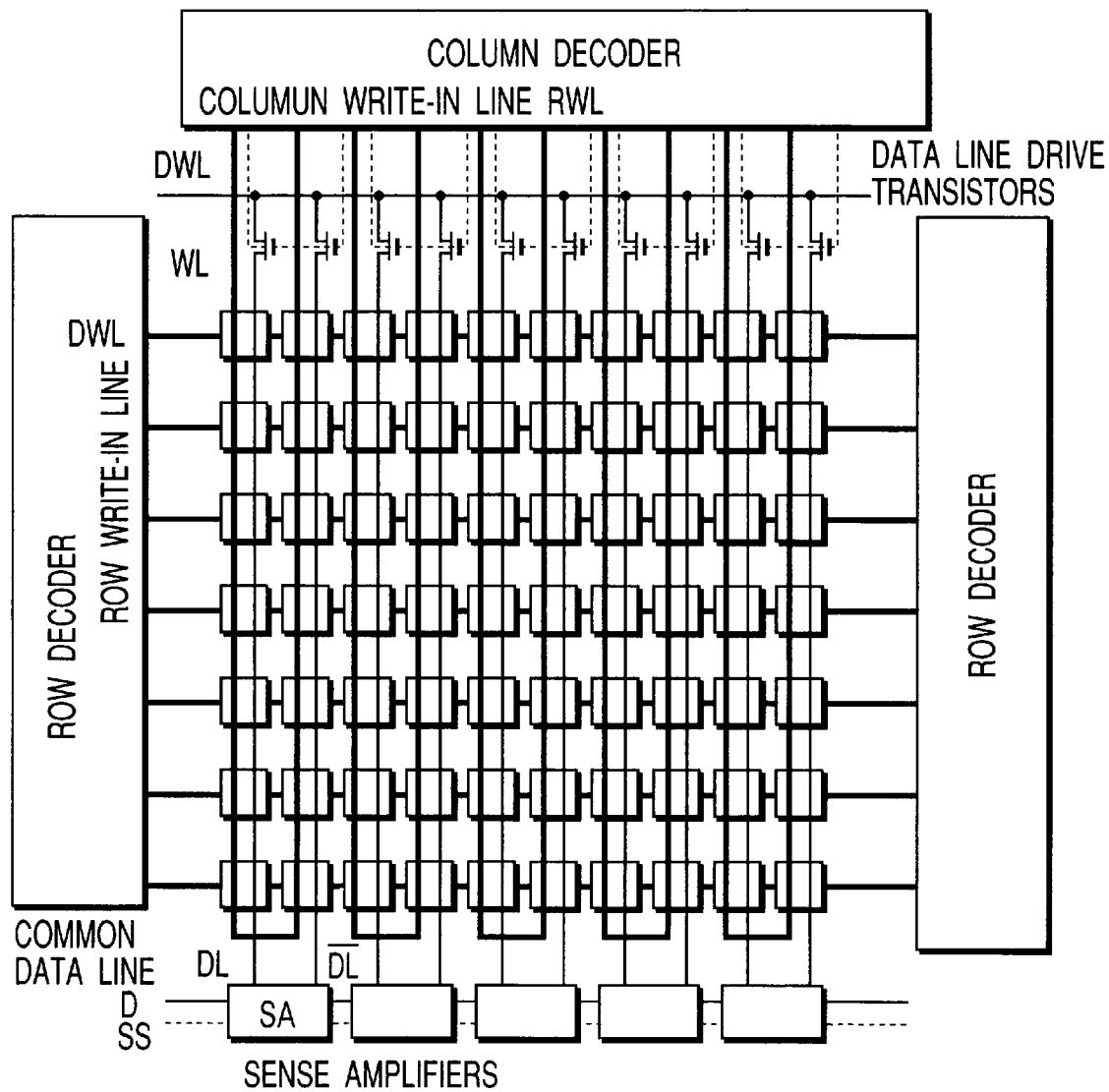
FIG. 37 is a view showing the entire configuration of the magnetic memory cell array in the twenty-second embodiment.

FIG. 37 is a view schematically showing the entire configuration of the magnetic memory cell array according to the present embodiment. A memory cell array including memory cells arranged in a two-dimensional manner; data line groups connected to these memory cells; word line groups; and write line groups crossing in the vicinity of memory cells. Write lines RWL and CWL in pair are connected to a column decoder and a row decoder, thereby enabling selective writing that corresponds to external address input.

On the other hand, the word line DWL for driving data line pairs DL and /DL and a word line WL for driving the cell selection transistor orthogonal to these word lines are connected to the column decoder and the row decoder, respectively, thereby enabling selective readout that corresponds to external address input. The sense amplifier SA is provided at each data line pair, and is driven by a common word line SS. Then, readout data is read out via the common data line D.

In this manner, in the present embodiment, one memory cell (for example, 201) is fabricated by two TMR elements (for example, 11 and 12), and memory cells are disposed respectively at a cross portion between each of the write lines 51a and 51b disposed in parallel to each other and the write line 52 orthogonal to these write lines. Thus, a current is supplied to the write lines 51a and 51b and the write line 52, whereby data can be selectively written into an arbitrary memory cell.

The directions of currents that flow through the write lines 51a and 51b are opposite to each other, and the magnetization directions of the recording layers 101 of the two TMR elements 11 and 12 that configure one memory cell 201 are anti-parallel to each other. Thus, during information readout operation, a difference between the outputs of the TMR elements 11 and 12 is acquired, whereby a differential signal that is greater than that of prior art can be obtained. In addition, the TMR elements 11 and 21 share the same cell selection transistor 32, making it possible to completely eliminate an offset of the output signal caused by a dispersion in transistor characteristics.

Therefore, according to the present embodiment, the cell output signal during readout operation can be increased, and a signal-noise ratio can be improved without causing any increase in power consumption and in the settling time during readout. Thus, low power consumption can be compatible with fast readout properties.

As described above in detail, use of the magnetic memory cell array structure of the present invention makes it possible to achieve significantly higher output and lower noise than a case using prior art during information readout. Therefore, a solid magnetic memory device compatible with low power consumption and fast readout properties can be provided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic memory device comprising:
    a memory cell assembled by first and second tunnel junction portions and a cell selection semiconductor element, each of said first and second tunnel junction portions being formed of a stack of a pinned layer in which a magnetization direction is fixed and a recording layer in which a magnetization direction changes depending on an external magnetic field, said stack having single or multiple tunnel junctions, said first tunnel junction section having a first end and a second end opposed to each other in the stacking direction, said second tunnel junction portion having a third end and a fourth end opposed to each other in the stacking direction;
    a first data line connected to said first end of said first tunnel junction section;
    a second data line connected to said third end of said second tunnel junction section; and
    a bit line connected to said second end of said first tunnel junction portion and said fourth end of said second tunnel junction section via said cell selection semiconductor element.

2. A magnetic memory device according to claim 1, further comprising:
    a first write line disposed at said first end of said first tunnel junction section;
    a second write line disposed at said third end of said second tunnel junction section; and
    a third write line disposed at said first end or said second end of said first tunnel junction section and at said third end or said fourth end of said second tunnel junction portion.

3. A magnetic memory device according to claim 2, wherein said first tunnel junction section is disposed in the same plane as that of said second tunnel junction section, said first write line is disposed in parallel to said second write line in the same plane, and said third write line crosses the second write line in the vicinity of said first and second tunnel junction sections, and a current direction that flows said first write line is opposite to a current direction that flows said second write line.

4. A magnetic memory device according to claim 2, wherein said first tunnel junction section is disposed in a direction vertical to said second tunnel junction section, said first write line and said second write line are disposed in parallel in a vertical direction, and said third write line crosses the second write line in the vicinity of said first and second tunnel junction sections, and a current direction that flows said first write line is opposite to a current direction that flows said second write line.

5. A magnetic memory device according to claim 1, wherein said first and second tunnel junction sections are equal to each other in a resistance value and a magneto resistance ratio, and have magnetization directions of said recording layers in said sections which are always kept in an anti-parallel each other.

6. A magnetic memory device according to claim 1, wherein one of said first tunnel junction section and said second tunnel junction section has a resistance lower than the other.

7. A magnetic memory device according to claim 1, wherein, when a potential difference is applied between each of said first data line connected to said first tunnel junction section and said second data line connected to said second tunnel junction section and said bit line, the magnitudes of qualities of currents that flow said first and second data lines are compared with each other, to discriminate the stored information.

8. A magnetic memory device according to claim 1, wherein, when a potential difference is applied between said first data line connected to said first tunnel junction section and said second data line connected to said second tunnel junction section, a reference potential and a voltage that appears in said bit line are compared with each other, to discriminate the stored information.

9. A magnetic memory device comprising:
   a magnetic memory cell array comprised of a plurality of divided memory cell arrays each having a plurality of magnetic memory cells,
   first and second data lines,
   a plurality of word lines crossing said first and/or second data lines, and
   a plurality of bit lines crossing said first and/or second data lines,
   wherein each of said magnetic memory cells is fabricated by first and second tunnel junction sections and a cell selection semiconductor element, each of said first and second tunnel junction sections being formed of a stack of a pinned layer having a magnetization direction fixed and a recording layer in which a magnetic direction changes depending on an external magnetic field, said stack has single or multiple tunnel junctions, said first tunnel junction section has a first end and a second end opposite to each other in the stacking direction, said second tunnel junction section has a third end and a fourth end opposite to each other in the stacking direction, said first end of said first tunnel junction section is connected to said first data line, said third end of said second tunnel junction section is connected to said second data line, said second end of said first tunnel junction section and said fourth end of said second tunnel junction section are connected to said bit line via said cell selection semiconductor element.

10. A magnetic memory device according to claim 9, wherein said first and second data lines are divided in a plurality of first and second subsidiary data lines, and said first end of said first tunnel junction section of each of said divided memory arrays is connected to a corresponding one of said first subsidiary data lines and said third end of said second tunnel junction section of each of said divided memory arrays is connected to a corresponding one of said second subsidiary data lines.

11. A magnetic memory device according to claim 9, wherein said first and second data lines are arranged in parallel.

12. A magnetic memory device according to claim 9, wherein said first and second data lines cross to each other.

13. A magnetic memory device comprising:
   a magnetic memory cell array comprised of a plurality of divided memory cell arrays, each having a plurality of magnetic memory cells,
   first and second data lines,
   a plurality of word lines crossing said first and/or second data lines,
   a plurality of bit lines arranged in parallel with said first and/or second data lines,
   wherein each of said magnetic memory cells is fabricated by first and second tunnel junction sections and a cell selection semiconductor element, each of said first and second tunnel junction portions is formed of a stack of a pinned layer having a magnetization direction fixed and a record layer in which a magnetic direction changes depending on an external magnetic field, said stack has single or multiple tunnel junctions, said first tunnel junction section has a first end and a second end opposite to each other in the stacking direction, said second tunnel junction portion has a third end and a fourth end opposite to each other in the stacking direction, said first end of said first tunnel junction section is connected to said first data line, said third end of said second tunnel junction section is connected to said second data line, said second end of said first tunnel junction portion and said fourth end of said second tunnel junction portion are connected to said bit line via said cell selection semiconductor element.

14. A magnetic memory device according to claim 13, wherein said first and second data lines are divided in a plurality of first and second subsidiary data lines, and said first end of said first tunnel junction section of each of said divided memory arrays is connected to a corresponding one of said first subsidiary data lines and said third end of said second tunnel junction section of each of said divided memory arrays is connected to a corresponding one of said second subsidiary data lines.

15. A magnetic memory device according to claim 13, wherein said first and second data lines are arranged in parallel.

16. A magnetic memory device according to claim 13, said first and second data lines cross to each other.

17. A magnetic memory device comprising:
   a magnetic memory cell array comprised of a plurality of divided memory cell arrays, each of said divided memory cell arrays being fabricated by a plurality of magnetic memory cells, first and second subsidiary data lines disposed in parallel to each other, a plurality of word lines crossing said first and/or second data lines, and a plurality of subsidiary bit lines parallel to said first and second data lines,
   wherein each of said magnetic memory cells is formed of first and second tunnel junction section and a cell selection semiconductor element, each of said first and second tunnel junction section comprises a stack of a pinned layer having a magnetization layer pinned therein and a record layer in which a magnetization direction changes depending on an external magnetization field, said first tunnel junction section has a first end and a second end opposite to each other in the stacking direction, said second tunnel junction section has a third end and a fourth end opposite to each other in the stacking direction, said first end of said first tunnel junction section is connected to said first subsidiary data line, said third end of said second tunnel junction section is connected to said second subsidiary data line, said second end of said first tunnel junction portion and said fourth end of said second tunnel junction section are connected to a corresponding one of said subsidiary bit lines, said magnetic memory device has a plurality of selection transistors for selectively connecting said first and second subsidiary data lines, said subsidiary bit lines, first and second data lines, and a bit line.

18. A magnetic memory device according to claim 17, wherein said semiconductor element is formed of a diode, and when a potential difference is applied between said first data line connected to said first tunnel junction section and said second data line connected to said second tunnel junction section via said diode, the magnitudes relevant to a reference potential of a voltage that appears in said bit line are compared with each other, to discriminate the stored information.

19. A magnetic memory device comprising:
a magnetic memory cell array comprised of a plurality of divided memory cell arrays each having a plurality of magnetic memory cells,
first and second data lines crossing to each other;
a plurality of word lines and a plurality of bit lines crossing to each other;
wherein each of said magnetic memory cells is fabricated by first and second tunnel junction sections and a cell selection semiconductor element, each of said first and second tunnel junction sections being formed of a stack of a pinned layer having a magnetization direction pinned therein and a record layer in which a magnetic direction changes depending on an external magnetic field, said stack has single or multiple tunnel junctions, said first tunnel junction portion has a first end and a second end opposite to each other in the stacking direction, said second tunnel junction portion has a third end and a fourth end opposite to each other in the stacking direction, said first end of said first tunnel junction section is connected to said first data line, said third end of said second tunnel junction section is connected to said second data line, said second end of said first tunnel junction section and said fourth end of said second tunnel junction section are connected to said bit line via said cell selection semiconductor element.

20. A magnetic memory device according to claim 19, wherein said first and second data lines are divided in a plurality of first and second subsidiary data lines, and said first end of said first tunnel junction section of each of said divided memory arrays is connected to a corresponding one of said first subsidiary data lines and said third end of said second tunnel junction section of each of said divided memory arrays is connected to a corresponding one of said second subsidiary data lines.

21. A magnetic memory device comprising:
a tunnel junction section including:
a stack of a first pinned layer having a magnetization direction fixed, a first tunnel barrier adjacent to said first pinned layer, a first magnetic layer which is opposite to said first pinned layer via said first tunnel barrier and in which a magnetization direction changes depending on an external magnetic field, a second magnetic layer which is anti-ferromagnetically coupled to said first ferromagnetic layer and in which a magnetization direction changes depending on the external magnetic field, and a non-magnetic conductive layer interposed between said first and second magnetic layers, for anti-ferromagnetically coupling between said first and second magnetic layers,
a second tunnel barrier adjacent to said second magnetic layer and
a second pinned layer opposite to said second magnetic layer via said second tunnel barrier and
a detection section configured to detect a current difference between a first tunnel current flowing across said first magnetic layer and said first pinned layer and a second tunnel current flowing across said second magnetic layer and said second pinned layer or a load voltage difference in a differential scheme.

22. A magnetic memory device comprising:
a tunnel junction including:
a stack of a first pinned layer having a magnetization direction fixed, a first tunnel barrier adjacent to said first pinned layer, a first magnetic layer which is opposite to said first pinned layer via said first tunnel barrier and in which a magnetization direction changes depending on an external magnetic field, a second magnetic layer which is anti-ferromagnetically coupled to said first ferromagnetic layer and in which a magnetization direction changes depending on the external magnetic field, and a non-magnetic conductive layer interposed between said first and second magnetic layers,
a second tunnel barrier adjacent to said second magnetic layer and
a second pinned layer opposite to said second magnetic layer via said second tunnel barrier,
a bit line electrically connected to all or either of said first magnetic layer, said non-magnetic conductive layer, and said second magnetic layer;
a first data line electrically connected to said first pinned layer; and
a second data line electrically connected to said second pinned layer.

23. A magnetic memory device according to claim 22, further comprising a detection section configured to detect a current difference between a first tunnel current flowing across said first magnetic layer and said first pinned layer and a second tunnel current flowing across said second magnetic layer and said second pinned layer or a load voltage difference in a differential scheme.

24. A magnetic memory device according to claim 22, which includes an electrode layer formed on one of said first pinned layer and said second pinned layer which is separated from a main surface of a substrate, for electrically connecting said bit line and all or either of said first magnetic layer, said non-magnetic conductive layer, and said second magnetic layer.

25. A magnetic memory device according to claim 22, wherein said first and second ferromagnetic layers differ in thickness from each other.

26. A magnetic memory device according to claim 22, wherein said first and second ferromagnetic layers are made of magnetic materials different from each other in magnetic moment, respectively.

* * * * *